US012619201B2

(12) United States Patent (10) Patent No.: US 12,619,201 B2
Ely et al. (45) Date of Patent: *May 5, 2026

(54) FORCE-DETECTING INPUT STRUCTURE

(71) Applicant: Apple Inc., Cupertino, CA (US)

(72) Inventors: Colin M. Ely, Sunnyvale, CA (US); Erik G. de Jong, San Francisco, CA (US); Fletcher R. Rothkopf, Los Altos, CA (US)

(73) Assignee: APPLE INC., Curpertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/889,878

(22) Filed: Sep. 19, 2024

(65) Prior Publication Data

US 2025/0013202 A1     Jan. 9, 2025

Related U.S. Application Data

(63) Continuation of application No. 18/217,944, filed on Jul. 3, 2023, now Pat. No. 12,105,479, which is a continuation of application No. 17/833,851, filed on Jun. 6, 2022, now Pat. No. 11,720,064, which is a continuation of application No. 17/187,519, filed on
(Continued)

(51) Int. Cl.
| | |
|---|---|
| *G04C 3/00* | (2006.01) |
| *G01D 5/241* | (2006.01) |
| *G04G 21/00* | (2010.01) |
| *G06F 3/0346* | (2013.01) |
(Continued)

(52) U.S. Cl.
CPC ........... *G04C 3/007* (2013.01); *G01D 5/2412* (2013.01); *G04G 21/00* (2013.01); *G06F*

3/0346 (2013.01); *G06F 3/0362* (2013.01); *H03K 17/975* (2013.01); *H03K 2217/960755* (2013.01)

(58) Field of Classification Search
CPC .............................. G06F 3/044; G06F 3/0414
See application file for complete search history.

(56) References Cited

U.S. PATENT DOCUMENTS

| | | | |
|---|---|---|---|
| 2,237,860 A | 4/1941 | Bolle | |
| 2,288,215 A | 6/1942 | Taubert et al. | |
(Continued)

FOREIGN PATENT DOCUMENTS

| | | |
|---|---|---|
| CH | 1888928 | 1/1937 |
| CN | 1302740 | 9/2001 |
(Continued)

OTHER PUBLICATIONS

Author Unknown, "Desirable Android Wear smartwatch from LG," Gulf News, Dubai, 3 pages, Jan. 30, 2015.
(Continued)

*Primary Examiner* — Muhammad N Edun
(74) *Attorney, Agent, or Firm* — Brownstein Hyatt Farber Schreck, LLP

(57) ABSTRACT

An input mechanism, such as a crown, detects amounts of applied force. In various examples, an assembly including an input mechanism has an enclosure; a stem coupled to the enclosure such that the stem is rotatable, translatable, and transversely moveable with respect to the enclosure; a sensor, coupled between the stem and the housing, to which force is transferred when the stem moves with respect to the housing; and a processing unit coupled to the sensor. The processing unit is operable to determine a measurement of the force, based on a signal from the sensor.

20 Claims, 12 Drawing Sheets

Related U.S. Application Data

Feb. 26, 2021, now Pat. No. 11,385,599, which is a continuation of application No. 16/738,198, filed on Jan. 9, 2020, now Pat. No. 10,948,880, which is a continuation of application No. 16/391,856, filed on Apr. 23, 2019, now Pat. No. 10,572,053, which is a continuation of application No. 16/022,563, filed on Jun. 28, 2018, now Pat. No. 10,296,125, which is a continuation of application No. 15/219,253, filed on Jul. 25, 2016, now Pat. No. 10,019,097.

(51) Int. Cl.
  *G06F 3/0362* (2013.01)
  *H03K 17/975* (2006.01)

(56) References Cited

U.S. PATENT DOCUMENTS

| | | |
|---|---|---|
| 2,497,935 A | 2/1950 | Feurer |
| 2,771,734 A | 11/1956 | Morf |
| 2,788,236 A | 4/1957 | Kafowi |
| 2,797,592 A | 7/1957 | Marrapese |
| 3,040,514 A | 6/1962 | Dinstman |
| 3,056,030 A | 9/1962 | Kelchner |
| 3,130,539 A | 4/1964 | Davis |
| 3,355,873 A | 12/1967 | Morf |
| 3,362,154 A | 1/1968 | Perret |
| 3,410,247 A | 11/1968 | Dronberger |
| 3,495,398 A | 2/1970 | Widmer et al. |
| 3,577,876 A | 5/1971 | Spadini |
| 3,621,649 A | 11/1971 | Vulcan et al. |
| 3,662,618 A | 5/1972 | Kroll et al. |
| 3,733,803 A | 5/1973 | Hiraga |
| 4,007,347 A | 2/1977 | Haber |
| 4,031,341 A | 6/1977 | Wuthrich et al. |
| 4,037,068 A | 7/1977 | Gaynor |
| 4,077,200 A | 3/1978 | Schneider |
| 4,133,404 A | 1/1979 | Griffin |
| 4,170,104 A | 10/1979 | Yamagata |
| 4,258,096 A | 3/1981 | LaMarche |
| 4,274,152 A | 6/1981 | Ikegami |
| 4,287,400 A | 9/1981 | Kitik |
| 4,289,400 A | 9/1981 | Kubola et al. |
| 4,311,026 A | 1/1982 | Ochoa |
| 4,311,990 A | 1/1982 | Burke |
| 4,324,956 A | 4/1982 | Sakakino et al. |
| 4,345,119 A | 8/1982 | Latasiewicz |
| 4,364,674 A | 12/1982 | Tesch |
| 4,379,642 A | 4/1983 | Meyrat |
| 4,395,134 A | 7/1983 | Luce |
| 4,396,298 A | 8/1983 | Ripley |
| 4,417,824 A | 11/1983 | Paterson et al. |
| 4,448,199 A | 5/1984 | Schmid |
| 4,520,306 A | 5/1985 | Kirby |
| 4,581,509 A | 4/1986 | Sanford et al. |
| 4,600,316 A | 7/1986 | Besson |
| 4,617,461 A | 10/1986 | Subbarao et al. |
| 4,634,861 A | 1/1987 | Ching et al. |
| 4,641,026 A | 2/1987 | Garcia, Jr. |
| 4,670,737 A | 6/1987 | Rilling |
| 4,766,642 A | 8/1988 | Gaffney et al. |
| 4,783,772 A | 11/1988 | Umemoto et al. |
| 4,884,073 A | 11/1989 | Souloumiac |
| 4,914,831 A | 4/1990 | Kanezashi et al. |
| 4,922,070 A | 5/1990 | Dorkinski |
| 4,931,794 A | 6/1990 | Haag |
| 4,952,799 A | 8/1990 | Loewen |
| 4,980,685 A | 12/1990 | Souloumiac et al. |
| 4,987,299 A | 1/1991 | Kobayashi et al. |
| 5,001,687 A | 3/1991 | Brien |
| 5,034,602 A | 7/1991 | Garcia et al. |
| 5,177,355 A | 1/1993 | Branan |
| 5,214,278 A | 5/1993 | Banda |
| 5,258,592 A | 11/1993 | Nishikawa et al. |
| 5,288,993 A | 2/1994 | Bidiville et al. |
| 5,347,123 A | 9/1994 | Jackson et al. |
| 5,383,166 A | 1/1995 | Gallay |
| 5,471,054 A | 11/1995 | Watanabe |
| 5,477,508 A | 12/1995 | Will |
| 5,509,174 A | 4/1996 | Worrell |
| 5,559,761 A | 9/1996 | Frenkel et al. |
| 5,572,314 A | 11/1996 | Hyman et al. |
| 5,583,560 A | 12/1996 | Florin et al. |
| 5,631,881 A | 5/1997 | Pessey et al. |
| 5,726,645 A | 3/1998 | Kamon et al. |
| 5,738,104 A | 4/1998 | Lo |
| 5,748,111 A | 5/1998 | Bates |
| 5,825,353 A | 10/1998 | Will |
| 5,841,050 A | 11/1998 | Clift et al. |
| 5,847,335 A | 12/1998 | Sugahara et al. |
| 5,867,082 A | 2/1999 | Van Zeeland |
| 5,943,233 A | 8/1999 | Ebina |
| 5,953,001 A | 9/1999 | Challener et al. |
| 5,960,366 A | 9/1999 | Duwaer et al. |
| 5,963,332 A | 10/1999 | Feldman et al. |
| 5,999,168 A | 12/1999 | Rosenberg et al. |
| 6,069,567 A | 5/2000 | Zawilski |
| 6,128,006 A | 10/2000 | Rosenberg et al. |
| 6,134,189 A | 10/2000 | Carrard |
| 6,154,201 A | 11/2000 | Levin et al. |
| 6,175,679 B1 | 1/2001 | Veligdan et al. |
| 6,203,190 B1 | 3/2001 | Stotz |
| 6,241,684 B1 | 6/2001 | Amano |
| 6,246,050 B1 | 6/2001 | Tullis et al. |
| 6,252,825 B1 | 6/2001 | Perotto |
| 6,304,247 B1 | 10/2001 | Black |
| 6,355,891 B1 | 3/2002 | Ikunami |
| 6,361,502 B1 | 3/2002 | Puolakanaho et al. |
| 6,377,239 B1 | 4/2002 | Isikawa |
| 6,392,640 B1 | 5/2002 | Will |
| 6,396,006 B1 | 5/2002 | Yokoji et al. |
| 6,422,740 B1 | 7/2002 | Leuenberger |
| 6,477,117 B1 | 11/2002 | Narayanaswami et al. |
| 6,502,982 B1 | 1/2003 | Bach et al. |
| 6,525,278 B2 | 2/2003 | Villain et al. |
| 6,556,222 B1 | 4/2003 | Narayanaswami |
| 6,575,618 B1 | 6/2003 | Inoue et al. |
| 6,587,400 B1 | 7/2003 | Line |
| 6,636,197 B1 | 10/2003 | Goldenberg et al. |
| 6,646,635 B2 | 11/2003 | Pogatetz et al. |
| 6,661,438 B1 | 12/2003 | Shiraishi et al. |
| 6,672,758 B2 | 1/2004 | Ehrsam et al. |
| 6,794,992 B1 | 9/2004 | Rogers |
| 6,809,275 B1 | 10/2004 | Cheng et al. |
| 6,834,430 B2 | 12/2004 | Worrell |
| 6,846,998 B2 | 1/2005 | Hasumi et al. |
| 6,882,596 B2 | 4/2005 | Guanter |
| 6,888,076 B2 | 5/2005 | Hetherington |
| 6,896,403 B1 | 5/2005 | Gau |
| 6,909,378 B1 | 6/2005 | Lambrechts et al. |
| 6,914,551 B2 | 7/2005 | Vidal |
| 6,961,099 B2 | 11/2005 | Takano et al. |
| 6,963,039 B1 | 11/2005 | Weng et al. |
| 6,967,903 B2 | 11/2005 | Guanter |
| 6,977,868 B2 | 12/2005 | Brewer et al. |
| 6,982,930 B1 | 1/2006 | Hung |
| 6,985,107 B2 | 1/2006 | Anson |
| 6,987,568 B2 | 1/2006 | Dana |
| 6,998,553 B2 | 2/2006 | Hisamune et al. |
| 7,016,263 B2 | 3/2006 | Gueissaz et al. |
| 7,021,442 B2 | 4/2006 | Borgerson |
| 7,031,228 B2 | 4/2006 | Born et al. |
| 7,034,237 B2 | 4/2006 | Ferri et al. |
| 7,081,905 B1 | 7/2006 | Raghunath et al. |
| 7,102,626 B2 | 9/2006 | Denny, III |
| 7,106,307 B2 | 9/2006 | Cok |
| 7,111,365 B1 | 9/2006 | Howie, Jr. |
| 7,113,450 B2 | 9/2006 | Plancon et al. |
| 7,119,289 B2 | 10/2006 | Lacroix |
| 7,135,673 B2 | 11/2006 | Saint Clair |
| 7,167,083 B2 | 1/2007 | Giles |
| 7,187,359 B2 | 3/2007 | Numata |
| 7,244,927 B2 | 7/2007 | Huynh |

(56)                 References Cited

U.S. PATENT DOCUMENTS

| | | |
|---|---|---|
| 7,255,473 B2 | 8/2007 | Hiranuma et al. |
| 7,265,336 B2 | 9/2007 | Hataguchi et al. |
| 7,274,303 B2 | 9/2007 | Dresti et al. |
| 7,285,738 B2 | 10/2007 | Lavigne et al. |
| 7,286,063 B2 | 10/2007 | Gauthey |
| 7,292,741 B2 | 11/2007 | Ishiyama et al. |
| 7,358,481 B2 | 4/2008 | Yeoh et al. |
| 7,369,308 B2 | 5/2008 | Tsuruta et al. |
| 7,371,745 B2 | 5/2008 | Ebright et al. |
| 7,385,874 B2 | 6/2008 | Vuilleumier |
| 7,404,667 B2 | 7/2008 | Born et al. |
| 7,465,917 B2 | 12/2008 | Chin et al. |
| 7,468,036 B1 | 12/2008 | Rulkov et al. |
| 7,506,269 B2 | 3/2009 | Lang et al. |
| 7,520,664 B2 | 4/2009 | Wai |
| 7,528,824 B2 | 5/2009 | Kong |
| 7,545,367 B2 | 6/2009 | Sunda et al. |
| 7,591,582 B2 | 9/2009 | Hiranuma et al. |
| 7,593,755 B2 | 9/2009 | Colando et al. |
| 7,605,846 B2 | 10/2009 | Watanabe |
| 7,634,263 B2 | 12/2009 | Louch et al. |
| 7,646,677 B2 | 1/2010 | Nakamura |
| 7,655,874 B2 | 2/2010 | Akieda |
| 7,682,070 B2 | 3/2010 | Burton |
| 7,708,457 B2 | 5/2010 | Girardin |
| 7,710,456 B2 | 5/2010 | Koshiba et al. |
| 7,732,724 B2 | 6/2010 | Otani et al. |
| 7,761,246 B2 | 7/2010 | Matsui |
| 7,763,819 B2 | 7/2010 | Ieda et al. |
| 7,772,507 B2 | 8/2010 | Orr |
| 7,778,115 B2 | 8/2010 | Ruchonnet |
| 7,781,726 B2 | 8/2010 | Matsui et al. |
| RE41,637 E | 9/2010 | O'Hara et al. |
| 7,791,587 B2 | 9/2010 | Kosugi |
| 7,791,588 B2 | 9/2010 | Tierling et al. |
| 7,791,597 B2 | 9/2010 | Silverstein et al. |
| 7,822,469 B2 | 10/2010 | Lo |
| 7,856,255 B2 | 12/2010 | Tsuchiya et al. |
| 7,858,583 B2 | 12/2010 | Schmidt et al. |
| 7,865,324 B2 | 1/2011 | Lindberg |
| 7,894,957 B2 | 2/2011 | Carlson |
| 7,946,758 B2 | 5/2011 | Mooring |
| 8,063,892 B2 | 11/2011 | Shahoian et al. |
| 8,138,488 B2 | 3/2012 | Grot |
| 8,143,981 B2 | 3/2012 | Washizu et al. |
| 8,167,126 B2 | 5/2012 | Stiehl |
| 8,169,402 B2 | 5/2012 | Shahoian et al. |
| 8,188,989 B2 | 5/2012 | Levin et al. |
| 8,195,313 B1 | 6/2012 | Fadell et al. |
| 8,229,535 B2 | 7/2012 | Mensinger et al. |
| 8,248,815 B2 | 8/2012 | Yang et al. |
| 8,263,886 B2 | 9/2012 | Lin et al. |
| 8,263,889 B2 | 9/2012 | Takahashi et al. |
| 8,275,327 B2 | 9/2012 | Yi et al. |
| 8,294,670 B2 | 10/2012 | Griffin et al. |
| 8,312,495 B2 | 11/2012 | Vanderhoff |
| 8,318,340 B2 | 11/2012 | Stimits |
| 8,368,677 B2 | 2/2013 | Yamamoto |
| 8,371,745 B2 | 2/2013 | Manni |
| 8,373,661 B2 | 2/2013 | Lan et al. |
| 8,405,618 B2 | 3/2013 | Colgate |
| 8,410,971 B2 | 4/2013 | Friedlander |
| 8,432,368 B2 | 4/2013 | Momeyer et al. |
| 8,439,559 B2 | 5/2013 | Luk et al. |
| 8,441,450 B2 | 5/2013 | Degner et al. |
| 8,446,713 B2 | 5/2013 | Lai |
| 8,456,430 B2 | 6/2013 | Oliver et al. |
| 8,477,118 B2 | 7/2013 | Lan et al. |
| 8,493,190 B2 | 7/2013 | Periquet et al. |
| 8,508,511 B2 | 8/2013 | Tanaka et al. |
| 8,525,777 B2 | 9/2013 | Stavely et al. |
| 8,562,489 B2 | 10/2013 | Burton et al. |
| 8,568,313 B2 | 10/2013 | Sadhu |
| 8,576,044 B2 | 11/2013 | Chapman |
| 8,593,598 B2 | 11/2013 | Chen et al. |
| 8,607,662 B2 | 12/2013 | Huang |
| 8,614,881 B2 | 12/2013 | Yoo |
| 8,624,836 B1 | 1/2014 | Miller et al. |
| 8,666,682 B2 | 3/2014 | LaVigne et al. |
| 8,677,285 B2 | 3/2014 | Tsern et al. |
| 8,704,787 B2 | 4/2014 | Yamamoto |
| 8,711,093 B2 | 4/2014 | Ong et al. |
| 8,717,151 B2 | 5/2014 | Forutanpour et al. |
| 8,724,087 B2 | 5/2014 | Van De Kerkhof et al. |
| 8,730,167 B2 | 5/2014 | Ming et al. |
| 8,743,088 B2 | 6/2014 | Watanabe |
| 8,783,944 B2 | 7/2014 | Doi |
| 8,797,153 B2 | 8/2014 | Vanhelle et al. |
| 8,804,993 B2 | 8/2014 | Shukla et al. |
| 8,816,962 B2 | 8/2014 | Obermeyer et al. |
| 8,824,245 B2 | 9/2014 | Lau et al. |
| 8,847,741 B2 | 9/2014 | Birnbaum et al. |
| 8,851,372 B2 | 10/2014 | Zhou |
| 8,859,971 B2 | 10/2014 | Weber |
| 8,860,674 B2 | 10/2014 | Lee et al. |
| 8,863,219 B2 | 10/2014 | Brown et al. |
| D717,679 S | 11/2014 | Anderssen |
| 8,878,657 B2 | 11/2014 | Periquet et al. |
| 8,885,856 B2 | 11/2014 | Sacha |
| 8,895,911 B2 | 11/2014 | Takahashi |
| 8,905,631 B2 | 12/2014 | Sakurazawa et al. |
| 8,908,477 B2 | 12/2014 | Peters |
| 8,920,022 B2 | 12/2014 | Ishida et al. |
| 8,922,399 B2 | 12/2014 | Bajaj et al. |
| 8,928,452 B2 | 1/2015 | Kim et al. |
| 8,948,832 B2 | 2/2015 | Hong et al. |
| 8,954,135 B2 | 2/2015 | Yuen et al. |
| 8,975,543 B2 | 3/2015 | Hakemeyer |
| 8,994,827 B2 | 3/2015 | Mistry et al. |
| 9,001,625 B2 | 4/2015 | Essery et al. |
| 9,024,733 B2 | 5/2015 | Wouters |
| 9,028,134 B2 | 5/2015 | Koshoji et al. |
| 9,030,446 B2 | 5/2015 | Mistry et al. |
| 9,034,666 B2 | 5/2015 | Vaganov et al. |
| 9,039,614 B2 | 5/2015 | Yuen et al. |
| 9,041,663 B2 | 5/2015 | Westerman |
| 9,042,971 B2 | 5/2015 | Brumback et al. |
| 9,049,998 B2 | 6/2015 | Brumback et al. |
| 9,052,696 B2 | 6/2015 | Breuillot et al. |
| 9,086,717 B2 | 7/2015 | Meerovitsch |
| 9,086,738 B2 | 7/2015 | Leung et al. |
| 9,091,309 B2 | 7/2015 | Battlogg |
| 9,100,493 B1 | 8/2015 | Zhou |
| 9,101,184 B2 | 8/2015 | Wilson |
| 9,105,413 B2 | 8/2015 | Hiranuma et al. |
| 9,123,483 B2 | 9/2015 | Ferri et al. |
| 9,134,807 B2 | 9/2015 | Shaw et al. |
| 9,141,087 B2 | 9/2015 | Brown et al. |
| 9,176,577 B2 | 11/2015 | Jangaard et al. |
| 9,176,598 B2 | 11/2015 | Sweetser et al. |
| 9,202,372 B2 | 12/2015 | Reams et al. |
| 9,213,409 B2 | 12/2015 | Redelsheimer et al. |
| 9,223,296 B2 | 12/2015 | Yang et al. |
| 9,241,635 B2 | 1/2016 | Yuen et al. |
| 9,244,438 B2 | 1/2016 | Hoover et al. |
| 9,256,209 B2 | 2/2016 | Yang et al. |
| 9,277,156 B2 | 3/2016 | Bennett et al. |
| 9,350,850 B2 | 5/2016 | Pope et al. |
| 9,367,146 B2 | 6/2016 | Piot |
| 9,386,932 B2 | 7/2016 | Chatterjee et al. |
| 9,426,275 B2 | 8/2016 | Eim et al. |
| 9,430,042 B2 | 8/2016 | Levin |
| 9,437,357 B2 | 9/2016 | Furuki et al. |
| 9,449,770 B2 | 9/2016 | Sanford et al. |
| 9,501,044 B2 | 11/2016 | Jackson et al. |
| 9,520,100 B2 | 12/2016 | Houjou et al. |
| 9,532,723 B2 | 1/2017 | Kim |
| 9,542,016 B2 | 1/2017 | Armstrong-Muntner |
| 9,545,541 B2 | 1/2017 | Aragones et al. |
| 9,552,023 B2 | 1/2017 | Joo et al. |
| 9,599,964 B2 | 3/2017 | Gracia |
| 9,600,071 B2 | 3/2017 | Rothkopf |
| 9,607,505 B2 | 3/2017 | Rothkopf et al. |
| 9,620,312 B2 | 4/2017 | Ely et al. |

(56) References Cited

U.S. PATENT DOCUMENTS

| | | |
|---|---|---|
| 9,627,163 B2 | 4/2017 | Ely |
| 9,632,318 B2 | 4/2017 | Goto et al. |
| 9,632,537 B2 | 4/2017 | Memering |
| 9,638,587 B2 | 5/2017 | Marquas et al. |
| 9,651,922 B2 | 5/2017 | Hysek et al. |
| 9,659,482 B2 | 5/2017 | Yang et al. |
| 9,680,831 B2 | 6/2017 | Jooste et al. |
| 9,709,956 B1 | 7/2017 | Ely et al. |
| 9,753,436 B2 | 9/2017 | Ely et al. |
| D800,172 S | 10/2017 | Akana |
| 9,800,717 B2 | 10/2017 | Ma et al. |
| 9,836,025 B2 | 12/2017 | Ely et al. |
| 9,873,711 B2 | 1/2018 | Hoover et al. |
| 9,874,945 B2 | 1/2018 | Fukumoto |
| 9,886,006 B2 | 2/2018 | Ely et al. |
| 9,891,590 B2 | 2/2018 | Shim et al. |
| 9,891,651 B2 | 2/2018 | Jackson et al. |
| 9,898,032 B2 | 2/2018 | Hafez et al. |
| 9,927,902 B2 | 3/2018 | Burr et al. |
| 9,939,923 B2 | 4/2018 | Sharma |
| 9,946,297 B2 | 4/2018 | Nazzaro et al. |
| 9,952,558 B2 | 4/2018 | Ely |
| 9,952,682 B2 | 4/2018 | Zhang et al. |
| 9,971,305 B2 | 5/2018 | Ely et al. |
| 9,971,405 B2 | 5/2018 | Salo et al. |
| 9,971,407 B2 | 5/2018 | Holenarsipur et al. |
| 9,979,426 B2 | 5/2018 | Na et al. |
| 10,001,817 B2 | 6/2018 | Zambetti et al. |
| 10,012,550 B2 | 7/2018 | Yang |
| 10,018,966 B2 | 7/2018 | Ely et al. |
| 10,019,097 B2 | 7/2018 | Ely et al. |
| 10,037,006 B2 | 7/2018 | Ely |
| 10,037,081 B2 | 7/2018 | Grant |
| 10,048,802 B2 | 8/2018 | Shedletsky |
| 10,061,399 B2 | 8/2018 | Bushnell et al. |
| 10,066,970 B2 | 9/2018 | Gowreesunker et al. |
| 10,092,203 B2 | 10/2018 | Mirov |
| 10,108,016 B2 | 10/2018 | Bosveld |
| 10,114,342 B2 | 10/2018 | Kim et al. |
| 10,145,711 B2 | 12/2018 | Boonsom et al. |
| 10,175,652 B2 | 1/2019 | Ely et al. |
| 10,190,891 B1 | 1/2019 | Rothkopf et al. |
| 10,203,662 B1 | 2/2019 | Lin et al. |
| 10,209,148 B2 | 2/2019 | Lyon et al. |
| 10,216,147 B2 | 2/2019 | Ely et al. |
| 10,222,756 B2 | 3/2019 | Ely et al. |
| 10,222,909 B2 | 3/2019 | Shedletsky et al. |
| 10,234,828 B2 | 3/2019 | Ely et al. |
| 10,241,593 B2 | 3/2019 | Chen |
| 10,296,125 B2 | 5/2019 | Ely et al. |
| 10,331,081 B2 | 6/2019 | Ely et al. |
| 10,331,082 B2 | 6/2019 | Ely et al. |
| 10,353,487 B2 | 7/2019 | Chung et al. |
| 10,379,629 B2 | 8/2019 | Bushnell et al. |
| 10,386,940 B2 | 8/2019 | Kim |
| 10,401,961 B2 | 9/2019 | Cruz-Hernandez et al. |
| 10,429,959 B2 | 10/2019 | Battlogg |
| 10,474,194 B1 | 11/2019 | Ell et al. |
| 10,503,258 B2 | 12/2019 | Holenarsipur et al. |
| 10,509,486 B2 | 12/2019 | Bushnell et al. |
| 10,524,671 B2 | 1/2020 | Lamego |
| 10,534,320 B2 | 1/2020 | Ferri et al. |
| 10,534,900 B2 | 1/2020 | Cheong et al. |
| 10,551,798 B1 | 2/2020 | Bushnell et al. |
| 10,572,053 B2 | 2/2020 | Ely et al. |
| 10,579,090 B2 | 3/2020 | Jackson et al. |
| 10,599,101 B2 | 3/2020 | Rothkopf et al. |
| 10,613,685 B2 | 4/2020 | Shedletsky |
| 10,627,783 B2 | 4/2020 | Rothkopf et al. |
| 10,655,988 B2 | 5/2020 | Boonsom et al. |
| 10,664,074 B2 | 5/2020 | Moussette et al. |
| 10,732,571 B2 | 8/2020 | Ely et al. |
| 10,845,764 B2 | 11/2020 | Ely et al. |
| 10,852,700 B2 | 12/2020 | Abramov |
| 10,852,855 B2 | 12/2020 | Niu |
| 10,871,385 B2 | 12/2020 | Kok |
| 10,936,071 B2 | 3/2021 | Pandya et al. |
| 10,948,880 B2 | 3/2021 | Ely et al. |
| 10,962,930 B2 | 3/2021 | Ely et al. |
| 10,962,935 B1 | 3/2021 | Ely et al. |
| 10,987,054 B2 | 4/2021 | Pandya et al. |
| 11,002,572 B2 | 5/2021 | Boonsom et al. |
| 11,029,831 B2 | 6/2021 | Block et al. |
| 11,194,298 B2 | 12/2021 | Roach et al. |
| 11,194,299 B1 | 12/2021 | Herrera |
| 11,347,351 B2 | 5/2022 | Shedletsky et al. |
| 11,513,613 B2 | 11/2022 | Bushnell et al. |
| 11,550,268 B2 | 1/2023 | Pandya et al. |
| 11,556,095 B2 | 1/2023 | Hiemstra et al. |
| 11,561,515 B2 | 1/2023 | Beyhs |
| 11,567,457 B2 | 1/2023 | Rothkopf et al. |
| 11,669,205 B2 | 6/2023 | Shedletsky et al. |
| 11,720,064 B2 | 8/2023 | Ely |
| 11,762,342 B2 | 9/2023 | Rothkopf et al. |
| 11,796,961 B2 | 10/2023 | Ely et al. |
| 11,815,860 B2 | 11/2023 | Pandya et al. |
| 11,860,587 B2 | 1/2024 | Taylor et al. |
| 12,045,416 B2 | 7/2024 | Shedletsky et al. |
| 2002/0101457 A1 | 8/2002 | Lang |
| 2003/0174590 A1 | 9/2003 | Arikawa et al. |
| 2004/0047244 A1 | 3/2004 | Iino et al. |
| 2004/0082414 A1 | 4/2004 | Knox |
| 2004/0130971 A1 | 7/2004 | Ecoffet et al. |
| 2004/0264301 A1 | 12/2004 | Howard et al. |
| 2005/0075558 A1 | 4/2005 | Vecerina et al. |
| 2005/0088417 A1 | 4/2005 | Mulligan |
| 2006/0250377 A1 | 11/2006 | Zadesky et al. |
| 2007/0013775 A1 | 1/2007 | Shin |
| 2007/0050054 A1 | 3/2007 | Sambandam Guruparan et al. |
| 2007/0182708 A1 | 8/2007 | Poupyrev et al. |
| 2007/0211042 A1 | 9/2007 | Kim et al. |
| 2007/0222756 A1 | 9/2007 | Wu et al. |
| 2007/0229671 A1 | 10/2007 | Takeshita et al. |
| 2007/0242569 A1 | 10/2007 | Inoue |
| 2007/0247421 A1 | 10/2007 | Orsley et al. |
| 2008/0130914 A1 | 6/2008 | Cho |
| 2008/0181059 A1 | 7/2008 | Wai |
| 2008/0185272 A1 | 8/2008 | Otani et al. |
| 2009/0051649 A1 | 2/2009 | Rondel |
| 2009/0073119 A1 | 3/2009 | Le et al. |
| 2009/0115748 A1 | 5/2009 | Tanaka et al. |
| 2009/0122656 A1 | 5/2009 | Bonnet et al. |
| 2009/0146975 A1 | 6/2009 | Chang |
| 2009/0152452 A1 | 6/2009 | Lee et al. |
| 2009/0217207 A1 | 8/2009 | Kagermeier et al. |
| 2009/0285443 A1 | 11/2009 | Camp et al. |
| 2009/0312051 A1 | 12/2009 | Hansson et al. |
| 2009/0312655 A1 | 12/2009 | Lo |
| 2010/0033430 A1 | 2/2010 | Kakutani et al. |
| 2010/0053468 A1 | 3/2010 | Havrill |
| 2010/0079225 A1 | 4/2010 | Washizu et al. |
| 2010/0081375 A1 | 4/2010 | Rosenblatt et al. |
| 2010/0149099 A1 | 6/2010 | Elias |
| 2011/0007468 A1 | 1/2011 | Burton et al. |
| 2011/0090148 A1 | 4/2011 | Li et al. |
| 2011/0158057 A1 | 6/2011 | Brewer et al. |
| 2011/0199301 A1 | 8/2011 | Zhao et al. |
| 2011/0242064 A1 | 10/2011 | Ono et al. |
| 2011/0249378 A1 | 10/2011 | Yoo |
| 2011/0270358 A1 | 11/2011 | Davis et al. |
| 2012/0067711 A1 | 3/2012 | Yang |
| 2012/0068857 A1 | 3/2012 | Rothkopf et al. |
| 2012/0075082 A1 | 3/2012 | Rothkopf et al. |
| 2012/0112859 A1 | 5/2012 | Park et al. |
| 2012/0113044 A1 | 5/2012 | Strazisar et al. |
| 2012/0206248 A1 | 8/2012 | Biggs |
| 2012/0272784 A1 | 11/2012 | Bailey et al. |
| 2013/0037396 A1 | 2/2013 | Yu |
| 2013/0087443 A1 | 4/2013 | Kikuchi |
| 2013/0191220 A1 | 7/2013 | Dent et al. |
| 2013/0235704 A1 | 9/2013 | Grinberg |
| 2013/0261405 A1 | 10/2013 | Lee et al. |
| 2013/0335196 A1 | 12/2013 | Zhang et al. |
| 2014/0009397 A1 | 1/2014 | Gillespie |

(56) References Cited

U.S. PATENT DOCUMENTS

| | | |
|---|---|---|
| 2014/0045547 A1 | 2/2014 | Singamsetty et al. |
| 2014/0071098 A1 | 3/2014 | You |
| 2014/0073486 A1 | 3/2014 | Ahmed et al. |
| 2014/0132516 A1 | 5/2014 | Tsai et al. |
| 2014/0143784 A1 | 5/2014 | Mistry |
| 2014/0197936 A1 | 7/2014 | Biggs et al. |
| 2014/0275852 A1 | 9/2014 | Hong |
| 2014/0340318 A1 | 11/2014 | Stringer et al. |
| 2014/0347289 A1 | 11/2014 | Suh et al. |
| 2014/0368442 A1 | 12/2014 | Vahtola |
| 2014/0375579 A1 | 12/2014 | Fujiwara |
| 2015/0041289 A1 | 2/2015 | Ely et al. |
| 2015/0049059 A1 | 2/2015 | Zadesky et al. |
| 2015/0098309 A1 | 4/2015 | Adams et al. |
| 2015/0124415 A1 | 5/2015 | Goyal et al. |
| 2015/0186609 A1 | 7/2015 | Utter, II |
| 2015/0221460 A1 | 8/2015 | Teplitxky et al. |
| 2015/0293592 A1 | 10/2015 | Cheong |
| 2015/0320346 A1 | 11/2015 | Chen |
| 2015/0338642 A1 | 11/2015 | Sanford |
| 2015/0366098 A1 | 12/2015 | Lapetina et al. |
| 2016/0018846 A1 | 1/2016 | Zenoff |
| 2016/0054813 A1 | 2/2016 | Shediwy et al. |
| 2016/0058375 A1 | 3/2016 | Rothkopf et al. |
| 2016/0061636 A1 | 3/2016 | Gowreesunker et al. |
| 2016/0062623 A1 | 3/2016 | Howard et al. |
| 2016/0069713 A1 | 3/2016 | Ruh et al. |
| 2016/0098016 A1 | 4/2016 | Ely et al. |
| 2016/0109861 A1 | 4/2016 | Kim et al. |
| 2016/0116306 A1 | 4/2016 | Ferri et al. |
| 2016/0147432 A1 | 5/2016 | Shi et al. |
| 2016/0170598 A1 | 6/2016 | Zambetti et al. |
| 2016/0170608 A1 | 6/2016 | Zambetti et al. |
| 2016/0170624 A1 | 6/2016 | Zambetti et al. |
| 2016/0241688 A1 | 8/2016 | Vossoughi |
| 2016/0253487 A1 | 9/2016 | Sarkar et al. |
| 2016/0306446 A1 | 10/2016 | Chung et al. |
| 2016/0320583 A1 | 11/2016 | Hall, Jr. |
| 2016/0327911 A1 | 11/2016 | Eim et al. |
| 2016/0338642 A1 | 11/2016 | Parara et al. |
| 2016/0378069 A1 | 12/2016 | Rothkopf et al. |
| 2016/0378070 A1 | 12/2016 | Rothkopf et al. |
| 2016/0378071 A1 | 12/2016 | Rothkopf et al. |
| 2017/0011210 A1 | 1/2017 | Cheong et al. |
| 2017/0027461 A1 | 2/2017 | Shin et al. |
| 2017/0031449 A1 | 2/2017 | Karsten et al. |
| 2017/0045958 A1 | 2/2017 | Battlogg et al. |
| 2017/0061863 A1 | 3/2017 | Eguchi |
| 2017/0069443 A1 | 3/2017 | Wang et al. |
| 2017/0069444 A1 | 3/2017 | Wang et al. |
| 2017/0069447 A1 | 3/2017 | Wang et al. |
| 2017/0089735 A1 | 3/2017 | Ruh |
| 2017/0090572 A1 | 3/2017 | Holenarsipur |
| 2017/0090599 A1 | 3/2017 | Kuboyama et al. |
| 2017/0104902 A1 | 4/2017 | Kim et al. |
| 2017/0139489 A1 | 5/2017 | Chen et al. |
| 2017/0216519 A1 | 8/2017 | Vouillamoz |
| 2017/0216668 A1 | 8/2017 | Burton et al. |
| 2017/0238138 A1 | 8/2017 | Aminzade |
| 2017/0251561 A1 | 8/2017 | Fleck et al. |
| 2017/0269715 A1 | 9/2017 | Kim et al. |
| 2017/0285404 A1 | 10/2017 | Kubota et al. |
| 2017/0301314 A1 | 10/2017 | Kim et al. |
| 2017/0307414 A1 | 10/2017 | Ferri et al. |
| 2017/0319082 A1 | 11/2017 | Sayme |
| 2017/0331869 A1 | 11/2017 | Bendahan et al. |
| 2017/0357465 A1 | 12/2017 | Dzeryn et al. |
| 2018/0018026 A1 | 1/2018 | Bushnell et al. |
| 2018/0136613 A1 | 5/2018 | Ely et al. |
| 2018/0136686 A1 | 5/2018 | Jackson et al. |
| 2018/0196517 A1 | 7/2018 | Tan et al. |
| 2018/0225701 A1 | 8/2018 | Han |
| 2018/0235491 A1 | 8/2018 | Bayley et al. |
| 2018/0239306 A1 | 8/2018 | Ely |
| 2018/0299834 A1 | 10/2018 | Ely et al. |
| 2018/0307363 A1 | 10/2018 | Ely et al. |
| 2018/0329368 A1 | 11/2018 | Ely et al. |
| 2018/0335891 A1 | 11/2018 | Shedletsky et al. |
| 2018/0337551 A1 | 11/2018 | Park |
| 2018/0341342 A1 | 11/2018 | Bushnell et al. |
| 2018/0364815 A1 | 12/2018 | Moussette et al. |
| 2019/0017846 A1 | 1/2019 | Boonsom et al. |
| 2019/0072902 A1 | 3/2019 | Ely et al. |
| 2019/0072911 A1 | 3/2019 | Ely et al. |
| 2019/0072912 A1 | 3/2019 | Pandya et al. |
| 2019/0146415 A1 | 5/2019 | Ely et al. |
| 2019/0163324 A1 | 5/2019 | Shedletsky |
| 2019/0250754 A1 | 8/2019 | Ely et al. |
| 2019/0278232 A1 | 9/2019 | Ely et al. |
| 2019/0294117 A1 | 9/2019 | Ely et al. |
| 2019/0302902 A1 | 10/2019 | Bushnell et al. |
| 2019/0317454 A1 | 10/2019 | Holenarsipur et al. |
| 2019/0391539 A1 | 12/2019 | Perkins et al. |
| 2020/0041962 A1 | 2/2020 | Beyhs |
| 2020/0064774 A1 | 2/2020 | Ely et al. |
| 2020/0064779 A1 | 2/2020 | Pandya et al. |
| 2020/0073339 A1 | 3/2020 | Roach et al. |
| 2020/0085331 A1 | 3/2020 | Chou |
| 2020/0110473 A1 | 4/2020 | Bushnell et al. |
| 2020/0150815 A1 | 5/2020 | Ely et al. |
| 2020/0159172 A1 | 5/2020 | Bushnell et al. |
| 2020/0233380 A1 | 7/2020 | Rothkopf |
| 2020/0233529 A1 | 7/2020 | Shedletsky et al. |
| 2020/0271483 A1 | 8/2020 | Boonsom |
| 2020/0326659 A1 | 10/2020 | Ely et al. |
| 2021/0055696 A1 | 2/2021 | Ely |
| 2021/0096688 A1 | 4/2021 | Shedletsky et al. |
| 2021/0181682 A1 | 6/2021 | Ely et al. |
| 2021/0181688 A1 | 6/2021 | Ely et al. |
| 2021/0181690 A1 | 6/2021 | Rothkopf et al. |
| 2021/0181691 A1 | 6/2021 | Rothkopf et al. |
| 2021/0181692 A1 | 6/2021 | Rothkopf et al. |
| 2021/0181865 A1 | 6/2021 | Bushnell et al. |
| 2021/0255590 A1 | 8/2021 | Ely et al. |
| 2021/0325168 A1 | 10/2021 | Lv et al. |
| 2021/0373501 A1 | 12/2021 | Pandya et al. |
| 2022/0043397 A1 | 2/2022 | Ely et al. |
| 2022/0043402 A1 | 2/2022 | Roach et al. |
| 2022/0074731 A1 | 3/2022 | Jang et al. |
| 2022/0075328 A1 | 3/2022 | Taylor |
| 2022/0171344 A1 | 6/2022 | Rothkopf et al. |
| 2023/0161299 A1 | 5/2023 | Beyhs |
| 2023/0213893 A1 | 7/2023 | Rothkopf et al. |
| 2023/0259235 A1 | 8/2023 | Shedletsky et al. |
| 2023/0393536 A1 | 12/2023 | Perkins et al. |
| 2023/0400818 A1 | 12/2023 | Davis et al. |
| 2023/0418230 A1 | 12/2023 | Ely et al. |
| 2024/0036523 A1 | 2/2024 | Pandya et al. |
| 2024/0045383 A1 | 2/2024 | Roach et al. |
| 2024/0053707 A1 | 2/2024 | Ely et al. |
| 2024/0126219 A1 | 4/2024 | Taylor et al. |

FOREIGN PATENT DOCUMENTS

| | | |
|---|---|---|
| CN | 1445627 | 10/2003 |
| CN | 1504843 | 6/2004 |
| CN | 1601408 | 3/2005 |
| CN | 1624427 | 6/2005 |
| CN | 1792295 | 6/2006 |
| CN | 1825224 | 8/2006 |
| CN | 101035148 | 9/2007 |
| CN | 101201587 | 6/2008 |
| CN | 201081979 | 7/2008 |
| CN | 101404928 | 4/2009 |
| CN | 201262741 | 6/2009 |
| CN | 101641663 | 2/2010 |
| CN | 101750958 | 6/2010 |
| CN | 201638168 | 11/2010 |
| CN | 101923314 | 12/2010 |
| CN | 102067070 | 5/2011 |
| CN | 102216959 | 10/2011 |
| CN | 202008579 | 10/2011 |
| CN | 102590925 | 7/2012 |
| CN | 102890443 | 1/2013 |

(56)　　　　　References Cited

FOREIGN PATENT DOCUMENTS

| CN | 202710937 | 1/2013 |
|---|---|---|
| CN | 103177891 | 6/2013 |
| CN | 103191557 | 7/2013 |
| CN | 103253067 | 8/2013 |
| CN | 103645804 | 3/2014 |
| CN | 203564224 | 4/2014 |
| CN | 103852090 | 6/2014 |
| CN | 203630524 | 6/2014 |
| CN | 103956006 | 7/2014 |
| CN | 203693601 | 7/2014 |
| CN | 203705837 | 7/2014 |
| CN | 203732900 | 7/2014 |
| CN | 103995456 | 8/2014 |
| CN | 104020660 | 9/2014 |
| CN | 203941395 | 11/2014 |
| CN | 104777987 | 4/2015 |
| CN | 104685794 | 6/2015 |
| CN | 204479929 | 7/2015 |
| CN | 204496177 | 7/2015 |
| CN | 104880937 | 9/2015 |
| CN | 104898406 | 9/2015 |
| CN | 204650147 | 9/2015 |
| CN | 105022947 | 11/2015 |
| CN | 105096979 | 11/2015 |
| CN | 105339871 | 2/2016 |
| CN | 105446125 | 3/2016 |
| CN | 205121417 | 3/2016 |
| CN | 105547146 | 5/2016 |
| CN | 105556433 | 5/2016 |
| CN | 105683876 | 6/2016 |
| CN | 105683877 | 6/2016 |
| CN | 105760067 | 7/2016 |
| CN | 105955519 | 9/2016 |
| CN | 205645648 | 10/2016 |
| CN | 205721636 | 11/2016 |
| CN | 205750744 | 11/2016 |
| CN | 106236051 | 12/2016 |
| CN | 106557218 | 4/2017 |
| CN | 206147524 | 5/2017 |
| CN | 206209589 | 5/2017 |
| CN | 107111342 | 8/2017 |
| CN | 107122088 | 9/2017 |
| CN | 107966895 | 4/2018 |
| CN | 209560397 | 10/2019 |
| DE | 2352016 | 4/1975 |
| DE | 3706194 | 9/1988 |
| DE | 102008023651 | 11/2009 |
| DE | 102016215087 | 3/2017 |
| EP | 0165548 | 12/1985 |
| EP | 0556155 | 8/1993 |
| EP | 1345095 | 9/2003 |
| EP | 1519452 | 3/2005 |
| EP | 1669724 | 6/2006 |
| EP | 1832969 | 9/2007 |
| EP | 2375295 | 10/2011 |
| EP | 2579186 | 4/2013 |
| EP | 2720129 | 4/2014 |
| EP | 2884239 | 6/2015 |
| FR | 2030093 | 10/1970 |
| FR | 2801402 | 5/2001 |
| GB | 887369 | 1/1962 |
| GB | 2433211 | 6/2007 |
| JP | S52151058 | 12/1977 |
| JP | S52164551 | 12/1977 |
| JP | S53093067 | 8/1978 |
| JP | S5478178 | 6/1979 |
| JP | S54087779 | 6/1979 |
| JP | S5708582 | 1/1982 |
| JP | S5734457 | 2/1982 |
| JP | S60103936 | 6/1985 |
| JP | S60103937 | 6/1985 |
| JP | H02285214 | 11/1990 |
| JP | H04093719 | 3/1992 |
| JP | H04157319 | 5/1992 |
| JP | H05203465 | 8/1993 |
| JP | H05312595 | 11/1993 |
| JP | H06050927 | 12/1994 |
| JP | H06331761 | 12/1994 |
| JP | H06347293 | 12/1994 |
| JP | H07116141 | 5/1995 |
| JP | H0914941 | 1/1997 |
| JP | H10161811 | 6/1998 |
| JP | H11121210 | 4/1999 |
| JP | H11191508 | 7/1999 |
| JP | 2000258559 | 9/2000 |
| JP | 2000316824 | 11/2000 |
| JP | 2000337892 | 12/2000 |
| JP | 2001084934 | 3/2001 |
| JP | 2001167651 | 6/2001 |
| JP | 2001202178 | 7/2001 |
| JP | 2001215288 | 8/2001 |
| JP | 2001289977 | 10/2001 |
| JP | 2001524206 | 11/2001 |
| JP | 2002071480 | 3/2002 |
| JP | 2002165768 | 6/2002 |
| JP | 2003036144 | 2/2003 |
| JP | 2003050668 | 2/2003 |
| JP | 2003151410 | 5/2003 |
| JP | 2003215271 | 7/2003 |
| JP | 2003331693 | 11/2003 |
| JP | 2004079410 | 3/2004 |
| JP | 2004184396 | 7/2004 |
| JP | 2004028979 | 11/2004 |
| JP | 2005017011 | 1/2005 |
| JP | 2005063200 | 3/2005 |
| JP | 2005099023 | 4/2005 |
| JP | 2005108630 | 4/2005 |
| JP | 2006101505 | 4/2006 |
| JP | 2006164275 | 6/2006 |
| JP | 3852854 | 12/2006 |
| JP | 2007101380 | 4/2007 |
| JP | 2007149620 | 6/2007 |
| JP | 2007248176 | 9/2007 |
| JP | 2007285748 | 11/2007 |
| JP | 2007311153 | 11/2007 |
| JP | 2008053980 | 3/2008 |
| JP | 2008122124 | 5/2008 |
| JP | 2008122377 | 5/2008 |
| JP | 2008170436 | 7/2008 |
| JP | 2008235226 | 10/2008 |
| JP | 2009009382 | 1/2009 |
| JP | 2009070657 | 4/2009 |
| JP | 2009519737 | 5/2009 |
| JP | 2009540399 | 11/2009 |
| JP | 2010032545 | 2/2010 |
| JP | 2010515153 | 5/2010 |
| JP | 2010165001 | 7/2010 |
| JP | 2010186572 | 8/2010 |
| JP | 2010243344 | 10/2010 |
| JP | 2010244797 | 10/2010 |
| JP | 2011021929 | 2/2011 |
| JP | 2011165468 | 8/2011 |
| JP | 2011221659 | 11/2011 |
| JP | 2012053801 | 3/2012 |
| JP | 2012221905 | 11/2012 |
| JP | 2013057516 | 3/2013 |
| JP | 2013079961 | 5/2013 |
| JP | 2013524189 | 6/2013 |
| JP | 3190075 | 4/2014 |
| JP | 5477393 | 4/2014 |
| JP | 2014512556 | 5/2014 |
| JP | 2014112222 | 6/2014 |
| JP | 2014174031 | 9/2014 |
| JP | 2018510451 | 4/2018 |
| KR | 20010030477 | 4/2001 |
| KR | 200278568 | 3/2002 |
| KR | 20030083340 | 10/2003 |
| KR | 20070011685 | 1/2007 |
| KR | 20070014247 | 2/2007 |
| KR | 100754674 | 9/2007 |
| KR | 20080028935 | 4/2008 |
| KR | 20080045397 | 5/2008 |
| KR | 100849684 | 8/2008 |
| KR | 1020080111563 | 12/2008 |

(56) References Cited

FOREIGN PATENT DOCUMENTS

| | | |
|---|---|---|
| KR | 2020100007563 | 7/2010 |
| KR | 20110011393 | 2/2011 |
| KR | 20110012784 | 2/2011 |
| KR | 20110103761 | 9/2011 |
| KR | 20110113368 | 10/2011 |
| KR | 20130036038 | 4/2013 |
| KR | 20130131873 | 12/2013 |
| KR | 20140051391 | 4/2014 |
| KR | 20140064689 | 5/2014 |
| KR | 20140104388 | 8/2014 |
| KR | 20160017070 | 2/2016 |
| KR | 20160048967 | 5/2016 |
| KR | 20170106395 | 9/2017 |
| KR | 102136836 | 7/2020 |
| NL | 1040225 | 11/2014 |
| RO | 129033 | 11/2013 |
| TW | 200633681 | 10/2006 |
| WO | WO2001/022038 | 3/2001 |
| WO | WO2001/069567 | 9/2001 |
| WO | WO2003/032538 | 4/2003 |
| WO | WO2010/058376 | 5/2010 |
| WO | WO2012/083380 | 6/2012 |
| WO | WO2012/094805 | 7/2012 |
| WO | WO2014/018118 | 1/2014 |
| WO | WO2014/200766 | 12/2014 |
| WO | WO2015/034149 | 3/2015 |
| WO | WO2015/116111 | 8/2015 |
| WO | WO2015122885 | 8/2015 |
| WO | WO2015/147756 | 10/2015 |
| WO | WO2016080669 | 5/2016 |
| WO | WO2016/104922 | 6/2016 |
| WO | WO2016/155761 | 10/2016 |
| WO | WO2016196171 | 12/2016 |
| WO | WO2016208835 | 12/2016 |
| WO | WO2017/013278 | 1/2017 |
| WO | WO2020173085 | 9/2020 |

OTHER PUBLICATIONS

Author Unknown, "Fossil Q ups smartwatch game with handsome design and build," Business Mirror, Makati City, Philippines, 3 pages, Dec. 20, 2016.

Author Unknown, "How Vesag Helps Kids Women and Visitors," http://www.sooperarticles.com/health-fitness-articles/children-health-articles/how-vesag-helps-kids-women-visitors-218542.html, 2 pages, at least as early as May 20, 2015.

Author Unknown, "mHealth," http://mhealth.vesag.com/?m=201012, 7 pages, Dec. 23, 2010.

Author Unknown, "mHealth Summit 2010," http://www.virtualpressoffice.com/eventsSubmenu.do?page=exhibitorPage&showId=1551&companyId=5394, 5 pages, Nov. 18, 2010.

Author Unknown, "MyKronoz ZeTime: World's Most Funded Hybrid Smartwatch Raised over $3M on Kickstarter, Running until Apr. 27," Business Wire, New York, New York, 3 pages, Apr. 21, 2017.

Author Unknown, "Re iPhone Universal Remote Control—Infrared Remote Control Accessory for iPhone and iPod touch," http://www.amazon.com/iPhone-Universal-Remote-Control-Accessory/dp/tech-data/B0038Z4 . . . , 2 pages, at least as early as Jul. 15, 2010.

Author Unknown, "Vesag Wrist Watch for Dementia Care from VYZIN," http://vyasa-kaaranam-ketkadey.blogspot.com/2011/03/vesag-wrist-watch-for-dementia-care.html, 2 pages, Mar. 31, 2011.

Author Unknown, "Vyzin Electronics Private Limited launches Vesag Watch," http://www.virtualpressoffice.com/showJointPage.do?page=jp&showId=1544, 5 pages, Jan. 6, 2011.

Author Unknown, "Vyzin Unveiled Personal Emergency Response System (PERS) with Remote Health Monitoring That Can Be Used for Entire Family," http://www.24-7pressrelease.com/press-release/vyzin-unveiled-personal-emergency-response-system-pers-with-remote-health-monitoring-that-can-be-used-for-entire-family-219317.php, 2 pages, Jun. 17, 2011.

Author Unknown, "DeskThorityNet, Optical Switch Keyboards," http://deskthority.net/keyboards-f2/optical-switch-keyboards-t1474.html, 22 pages, Jul. 11, 2015.

Epstein et al., "Economical, High-Performance Optical Encoders," Hewlett-Packard Journal, pp. 99-106, Oct. 1988. [text only version].

GreyB, "Google Watch: Convert your arm into a keyboard," http://www.whatafuture.com/2014/02/28/google-smartwatch/#sthash.Yk35cDXK.dpbs, 3 pages, Feb. 28, 2014.

IBM, "Additional Functionality Added to Cell Phone via "Learning" Function Button," www.ip.com, 2 pages, Feb. 21, 2007.

Kim, Joseph, "2010 mHealth Summit Emerges as Major One-Stop U.S. Venue for Mobile Health," http://www.medicineandtechnology.com/2010/08/2010-mhealth-summit-emerges-as-major.html, 3 pages, Aug. 26, 2010.

Krishnan et al., "A Miniature Surface Mount Reflective Optical Shaft Encoder," Hewlett-Packard Journal, Article 8, pp. 1-6, Dec. 1996.

Narayanaswami et al., "Challenges and considerations for the design and production of a purpose-optimized body-worn wrist-watch computer," Defense, Security, and Cockpit Displays, 2004.

M.T. Raghunath et al., User Interfaces for Applications on a Wrist Watch, Personal and Ubiquitous Computing, vol. 6, No. 1, 2002, Springer.

Rick, "How VESAG Helps Health Conscious Citizens," http://sensetekgroup.com/2010/11/29/wireless-health-monitoring-system/, 2 pages, Nov. 29, 2010.

Sadhu, Rajendra, "How VESAG Helps People Who Want to 'Be There'?," http://ezinearticles.com/?How-Vesag-Helps-People-Who-Want-to-Be-There?&id-5423873, 1 page, Nov. 22, 2010.

Sadhu, Rajendra, "Mobile Innovation Helps Dementia and Alzheimer's Patients," http://www.itnewsafrica.com/2010/11/mobile-innovation-helps-dementia-andalzheimer%E2%80%99s-patients/, 3 pages, Nov. 22, 2010.

Sherr, Sol, "Input Devices," p. 55, Mar. 1988.

Tran et al., "Universal Programmable Remote Control/Telephone," www.ip.com, 2 pages, May 1, 1992.

FORCE-DETECTING INPUT STRUCTURE

CROSS-REFERENCE TO RELATED APPLICATIONS

This application is a continuation patent application of U.S. patent application Ser. No. 18/217,944, filed Jul. 3, 2023 and titled "Force-Detecting Input Structure," which is a continuation patent application of U.S. patent application Ser. No. 17/833,851, filed Jun. 6, 2022, and titled "Force-Detecting Input Structure," now U.S. Pat. No. 11,720,064, issued Aug. 8, 2023, which is a continuation patent application of U.S. patent application Ser. No. 17/187,519, filed Feb. 26, 2021, and titled "Force-Detecting Input Structure," now U.S. Pat. No. 11,385,599, issued Jul. 12, 2022, which is a continuation patent application of U.S. patent application Ser. No. 16/738,198, filed Jan. 9, 2020, and titled "Force-Detecting Input Structure," now U.S. Pat. No. 10,948,880, issued Mar. 16, 2021, which is a continuation patent application of U.S. patent application Ser. No. 16/391,856, filed Apr. 23, 2019, and titled "Force-Detecting Input Structure," now U.S. Pat. No. 10,572,053, issued Feb. 25, 2020, which is a continuation patent application of U.S. patent application Ser. No. 16/022,563, filed Jun. 28, 2018, and titled "Force-Detecting Input Structure," now U.S. Pat. No. 10,296,125, issued May 21, 2019, which is a continuation patent application of U.S. patent application Ser. No. 15/219,253, filed Jul. 25, 2016, and titled "Force-Detecting Input Structure," now U.S. Pat. No. 10,019,097, issued Jul. 10, 2018, the disclosures of which are hereby incorporated herein by reference in their entirety.

FIELD

The described embodiments relate generally to input mechanisms such as crowns. More particularly, the present embodiments relate to an input mechanism, such as a crown, that detects the amount of force applied.

BACKGROUND

Many devices, such as wearable electronic devices, use various input mechanisms to receive user input. Many devices, particularly small form factor devices, such as watches, smart watches, wearable devices, and so on, may have a limited number of input mechanisms For example, many watches include a crown or similar input mechanisms. Some crowns can be rotated to wind the watch. Other crowns may be translated into a time-changing position whereupon they may be rotated to change the time of the watch.

SUMMARY

The present disclosure relates to an input mechanism, such as a crown, button, key, surface, or the like, that detects applied force. The input mechanism may be included in an electronic device. A user may provide input by rotating the input mechanism, translating the input mechanism, moving the input mechanism transversely, and so on. The input mechanism may include one or more force sensors that the electronic device may use to determine a non-binary amount of the force applied to the input mechanism. As the electronic device may determine non-binary amounts of force corresponding to different types of movement, the input mechanism may be used to receive a variety of different input.

In various embodiments, an electronic device includes a housing, a collar coupled to the housing, and an input structure extending from the collar. The collar includes a moveable conductor, a conductive element, and a separation defined between the moveable conductor and the conductive element. Movement of the input structure changes a capacitance between the moveable conductor and the conductive element.

In some examples, the electronic device further includes a processing unit operative to determine an amount of force applied to the input structure based on the change in capacitance. In numerous examples, the electronic device further includes silicone disposed within the separation.

In various examples, the conductive element includes a flex circuit that extends through at least part of the collar into the housing. In some examples, the collar includes an inner core to which the conductive element is coupled and a compliant material disposed in the separation that couples the conductive element and the moveable conductor. In numerous examples, the input structure is operable to move without changing the capacitance between the moveable conductor and the conductive element.

In some embodiments, an input mechanism assembly includes an enclosure and a stem coupled to the enclosure, such that the stem is rotatable with respect to the enclosure, translatable toward and away from the enclosure, and transversely moveable with respect to the enclosure. The input mechanism assembly further includes a sensor, coupled between the stem and the enclosure, to which force is transferred when the stem moves transversely with respect to the enclosure and a processing unit, coupled to the sensor, operable to determine a measurement of the force, based on a signal from the sensor. The processing unit may also be operative to determine a direction in which the stem moves transversely.

In various examples, the sensor is a strain gauge. In other examples, the sensor includes a first conductor, a second conductor, and a dielectric separating the first and second conductors. The dielectric may be a compliant material.

In numerous examples, input mechanism assembly further includes a collar coupled to the housing and the sensor couples the stem to the collar. In various examples, input mechanism assembly further includes a wireless transmission mechanism that wirelessly couples the processing unit and the sensor. In some examples, input mechanism assembly further includes an additional sensor coupled between the stem and the processing unit and the processing unit is operable to determine a measurement of a force that translates the stem, based on a signal from the additional sensor.

In numerous embodiments, an electronic device, comprising: a body; a coupler positioned at least partially within the body; an input mechanism, connected to the coupler, operable to move with respect to the body; a capacitive sensor, coupled to the input mechanism, to which force is transferred when the input mechanism moves; and a processing unit operable to ascertain an amount of the force based on a change in a capacitance of the capacitive sensor.

In various examples, the coupler includes the capacitive sensor. In some examples, the capacitive sensor includes a first capacitive element, a second capacitive element, and a compliant material positioned between the first and second capacitive elements. In some implementations of such examples, the compliant material extends between the coupler and the body and seals the coupler to the body.

In some examples, the input mechanism moves transverse with respect to the body. In various examples, a portion of the input mechanism moves closer to the body. In numerous examples, a change in proximity between the first and second conductors is proportional to the amount of the force.

BRIEF DESCRIPTION OF THE DRAWINGS

The disclosure will be readily understood by the following detailed description in conjunction with the accompanying drawings, wherein like reference numerals designate like structural elements.

DETAILED DESCRIPTION

Reference will now be made in detail to representative embodiments illustrated in the accompanying drawings. It should be understood that the following descriptions are not intended to limit the embodiments to one preferred embodiment. To the contrary, it is intended to cover alternatives, modifications, and equivalents as can be included within the spirit and scope of the described embodiments as defined by the appended claims.

The description that follows includes sample systems, methods, and apparatuses that embody various elements of the present disclosure. However, it should be understood that the described disclosure may be practiced in a variety of forms in addition to those described herein.

The following disclosure relates to a crown or other input mechanism or structure, such as a button, key, switch, surface, or the like, that may be included in an electronic device. The input structure may rotate, translate, move transversely, and so on. The input structure may include one or more force sensors positioned in the input structure that may be used to determine an amount of applied force applied. As the electronic device may determine applied force corresponding to different types of movement, the input structure may be used to receive a variety of different inputs.

These and other embodiments are discussed below with reference to FIGS. 1-10. However, those skilled in the art will readily appreciate that the detailed description given herein with respect to these Figures is for explanatory purposes only and should not be construed as limiting.

Figure 1:
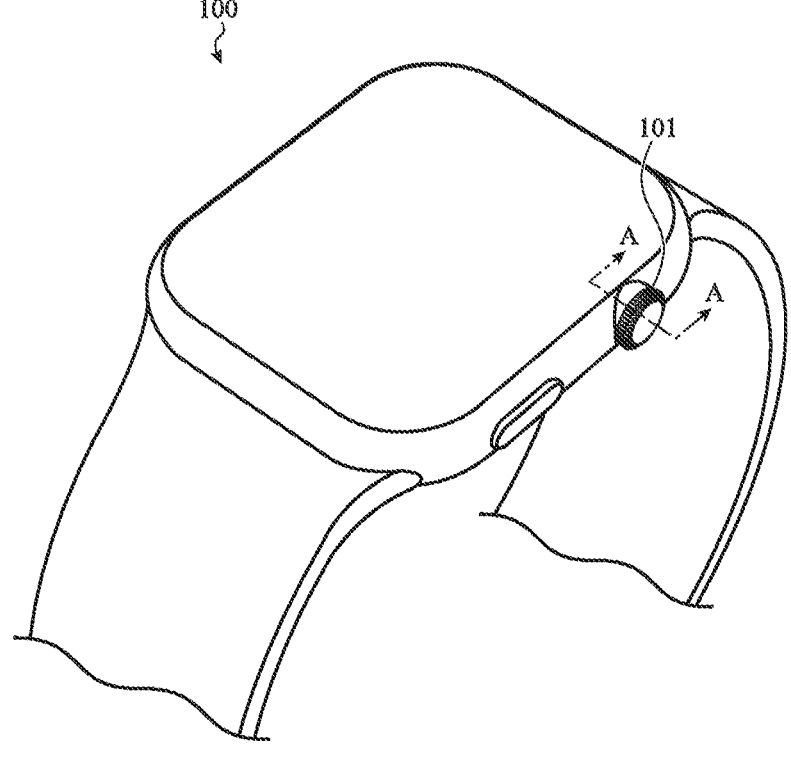
FIG. 1 depicts an example electronic device including a force-detecting input structure.

FIG. 1 depicts an example electronic device 100, including a force-detecting input structure 101. The electronic device 100 may be operable to receive input from a user. The electronic device 100 may also be operable to perform various actions in response to input received via the force-detecting input structure 101. The electronic device 100 may receive different inputs based on rotation of the force-detecting input structure 101, translation of the force-detecting input structure 101, transverse movement of the force-detecting input structure 101, application of force to the force-detecting input structure 101, and so on.

When force is exerted on the force-detecting input structure 101, the electronic device 100 may ascertain or measure the force. Generally, the electronic device 100 may interpret different amounts of force as different inputs.

Figure 2A:
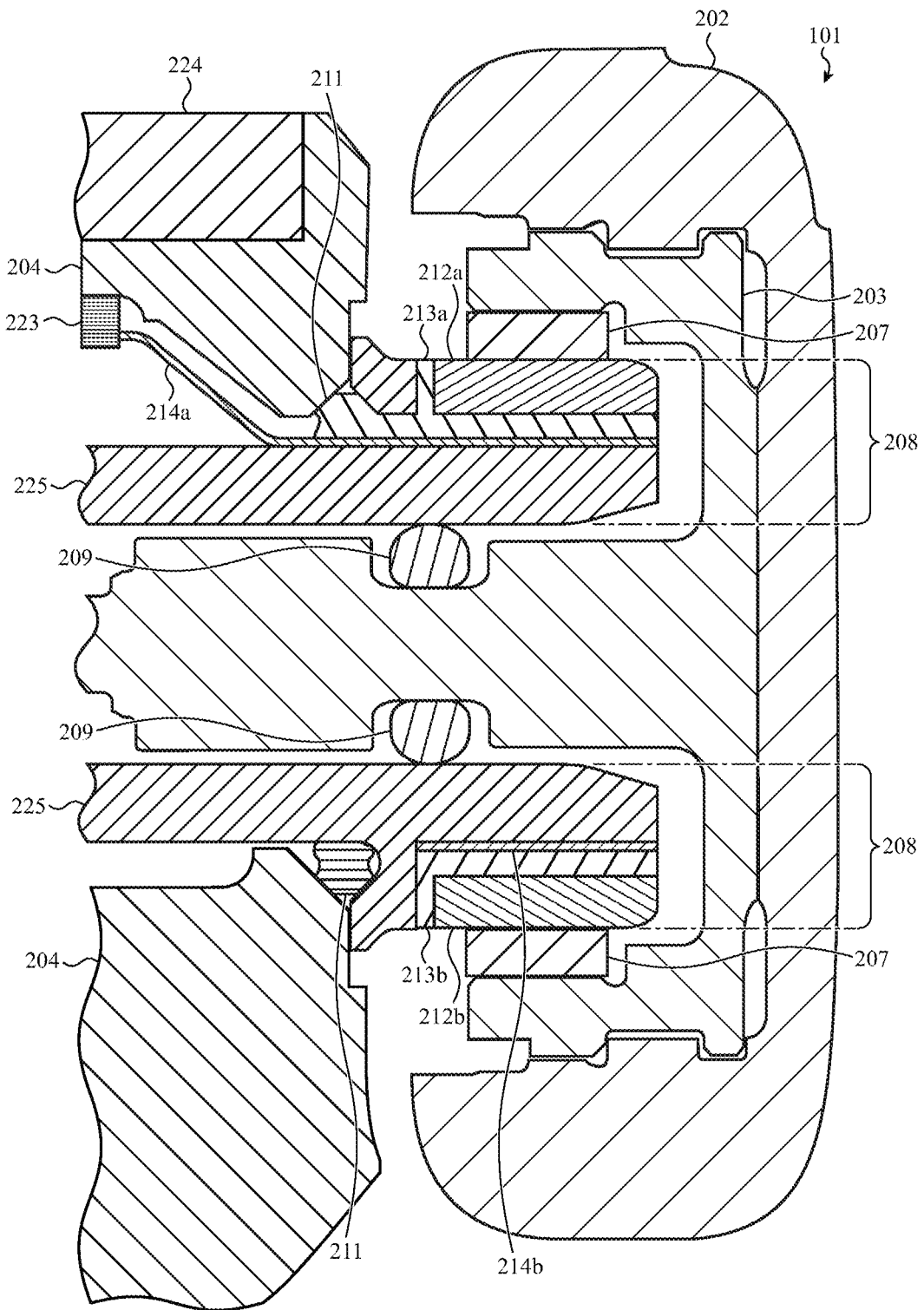
FIG. 2A depicts a schematic cross-sectional view of the electronic device of FIG. 1, taken along A-A of FIG. 1, illustrating a first example of the force-detecting input structure.

FIG. 2A depicts a schematic cross-sectional view of the electronic device 100 of FIG. 1, taken along A-A of FIG. 1, illustrating a first example of a force-detecting input structure 101. As shown, the input structure 101 is a crown in this example. The input structure 101 includes a stem 203 that is coupled to a housing 204, body, or other enclosure of the electronic device 100. The input structure 101 is coupled to the housing 204 via a collar 208 or other coupler, bushing 207, and one or more gaskets 209.

Figure 2B:
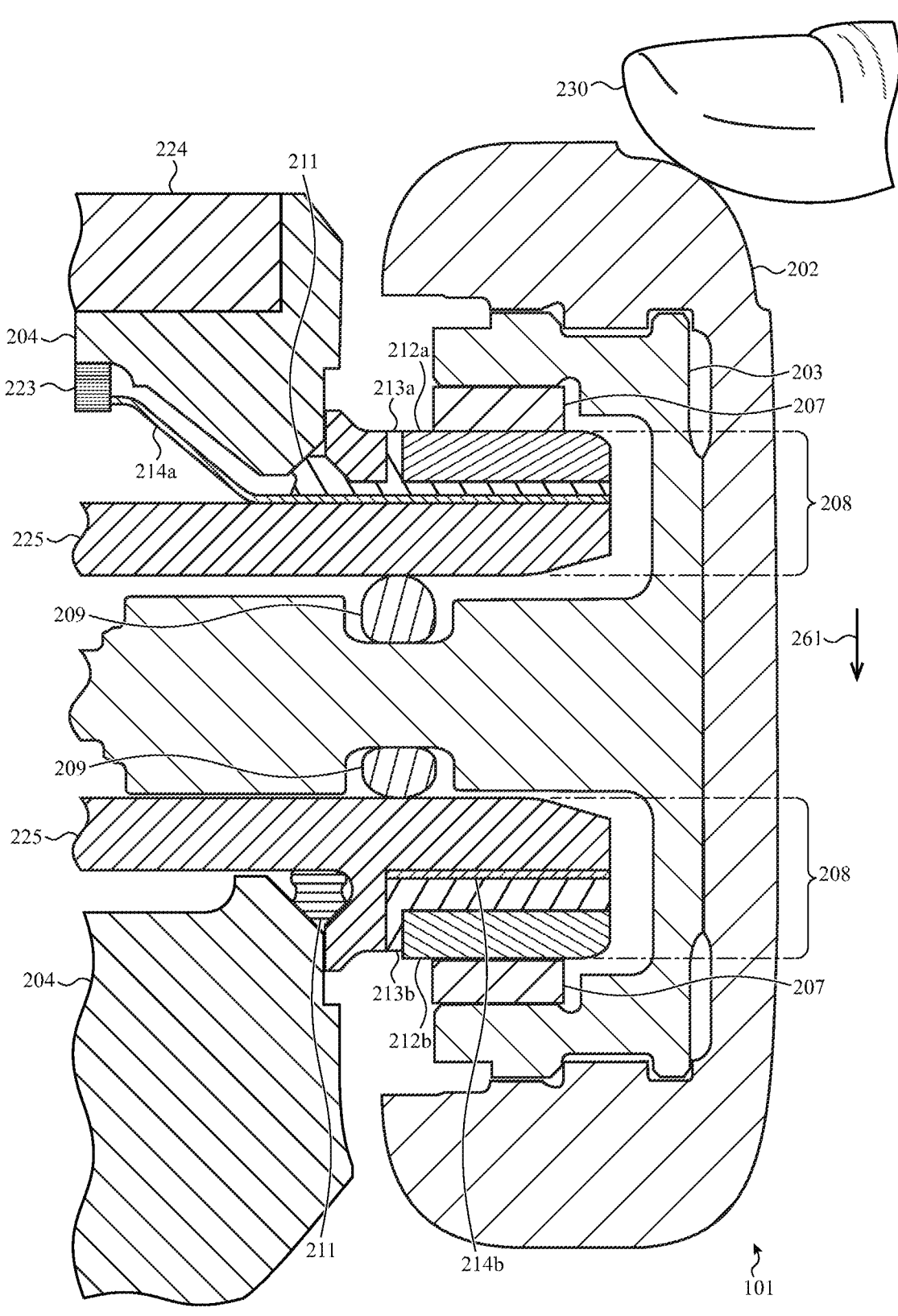
FIG. 2B depicts the electronic device of FIG. 2A while a user is exerting force to move the input structure transversely with respect to a housing of the electronic device.
Figure 2C:
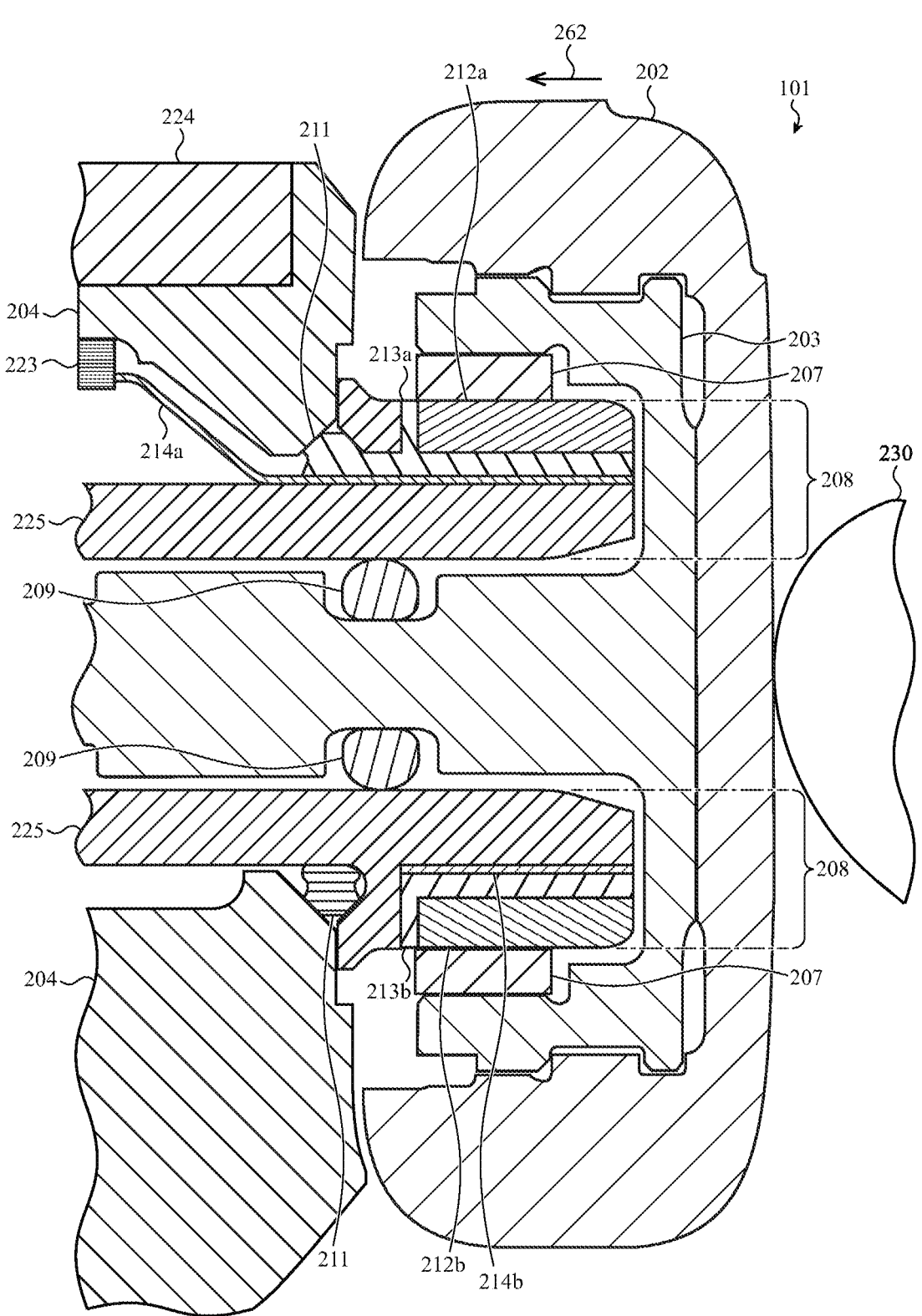
FIG. 2C depicts the electronic device of FIG. 2A while a user is exerting force to translate the input structure towards the housing of the electronic device.

With reference to FIGS. 2A-2C, the input mechanism assembly involving the input structure 101 will now be described in more detail. The collar 208 may be positioned an aperture defined by the housing 204 (e.g., a first aperture). A gasket 211 may be compressed between the collar 208 and the housing 204, coupling the collar 208 to the housing 204. The gasket 211 may form a seal or other barrier against passage of contaminants. The seal may be a liquid seal. The collar 208 may define an aperture (e.g., a second aperture). A portion of the stem 203 is positioned in the aperture defined by the collar 208.

The collar 208 includes an inner core 225. Flex circuits 214a, 214b or other conductors are coupled to the inner core 225. The collar 208 also includes compliant silicone 213a, 213b or other compliant dielectric material coupled to the flex circuits 214a, 214b. The compliant silicone 213a, 213b may be a portion of the gasket 211 that extends at least partially through the collar 208. The collar 208 further includes moveable conductors 212a, 212b coupled to the compliant silicone 213a, 213b.

The stem 203 is slideably coupled at least partially around the collar 208 by one or more bushings 207. The portion of the stem 203 extending from the collar 208 is further slideably coupled at least partially within the collar 208 by one or more gaskets 209 (such as one or more o-rings). These slideable couplings allows the stem 203 to rotate with respect to the housing 204 and the collar 208.

In some embodiments, the bushing 207 and/or the gasket 209 may be formed from compliant materials such as high molecular weight polyethylene, elastomer, and so on. In various embodiments, the stem 203 and/or the collar 208 may be formed of polished or coated titanium or other suitable materials that further permit the stem 203 to slide within and around the collar 208. The bushing 207 and the gasket 209 may bear the majority of the stress relating to sliding of the stem 203.

A cap 202, knob, or similar structure may be coupled to the stem 203. In some implementations, the stem 203 may snap to fit into the cap 202. In various implementations, the stem 203 may be bonded or otherwise attached to the cap 202, such as by an adhesive.

Force detection using the input structure 101 will now be described. The collar 208 includes a number of capacitive sensors formed by the flex circuits 214a, 214b, compliant silicone 213a, 213b, and the moveable conductors 212a, 212b. A capacitance of these respective capacitive sensors may be dependent on the proximity of the respective capacitive elements (e.g., the moveable conductors 212a, 212b and the flex circuits 214a, 214b) across separations defined between the respective capacitive elements. Compliant silicone 213a, 213b is positioned within the separations. The compliant silicone 213a, 213b deforms under the application of force to allow the moveable conductors 212a, 212b to move closer to and further away from the flex circuits 214a, 214b, altering the capacitance between these respective capacitive elements.

The movement of the moveable conductors 212a, 212b with respect to the flex circuits 214a, 214b may be proportional to the force exerted. Similarly, the changes in capacitance of the capacitive sensors may be proportional to the movement of the moveable conductors 212a, 212b with respect to the flex circuits 214a, 214b. Thus, the changes in capacitance between the capacitive elements may be proportional to the force exerted.

A processing unit 223 is electrically coupled to the flex circuits 214a, 214b or other conductive elements. The processing unit 223 receives signals that indicate changes in capacitance between the respective capacitive elements. The processing unit 223 correlates these changes in capacitance to amounts of force to determine the force applied to the input structure 101. For example, the processing unit 223 may utilize a lookup table or other data structure stored in a non-transitory storage medium correlating capacitances and force amounts. The processing unit 223 may be able to determine non-binary amounts forces that are applied.

Transverse movement of the input structure 101 (e.g., movement in one of the directions 262 shown in FIG. 2B) will now be described. Force applied to the input structure 101 is transferred by the stem 203 to the respective moveable conductors 212a, 212b, and therefore to the compliant silicone 213a, 213b. This transferred force deforms the compliant silicone 213a, 213b, thereby changing the proximity between the moveable conductors 212a, 212b and the flex circuits 214a, 214b. These changes in proximity may alter capacitance between the moveable conductors 212a, 212b and the flex circuits 214a, 214b.

FIG. 2B depicts the electronic device 100 of FIG. 2A while a user 230 is exerting force to transversely move the input structure 101 in one of the directions 261 shown in FIG. 2B. The stem 203 receives and transfers the exerted force to the collar 208. This transferred force deforms the compliant silicone 213a, 213b. This shifts the moveable conductor 212a closer to the flex circuit 214a. This also shifts the moveable conductor 212b further from the flex circuit 214b. The change in proximity between the moveable conductors 212a, 212b and the flex circuits 214a, 214b changes the capacitance of the respective capacitive sensors formed thereby. The processing unit 223 analyzes these changes in capacitance to determine the amount of the force exerted on the input structure 101.

Additionally, the processing unit 223 may analyze changes in capacitance to determine other information. For example, the processing unit 223 may analyze changes in capacitance to determine a direction in which the force is applied, additional forces applied to the input structure 101, a direction of the transverse movement of the input structure 101, and so on. For example, force applied in the direction shown in FIG. 2B may result in an increase in the capacitance of the capacitive sensor (e.g., force sensor) formed by the moveable conductor 212a and the flex circuit 214a and a decrease in capacitance of the capacitive sensor formed by the moveable conductor 212b and the flex circuit 214b. The processing unit 223 may compare the changes in capacitance to determine that the force is applied in the direction shown in FIG. 2B.

Translational movement (e.g., movement in one of the directions 262 shown in FIG. 2C) of the input structure 101 will now be described. The slideable coupling of the stem 203 with respect to the collar 208 by the bushing 207 and the gasket 209 also allows the stem 203 to move toward the housing 204 and the collar 208 and/or away from the housing 204 and the collar in one of the directions 262 shown in FIG. 2C. Thus, the stem 203 is translatable. Similarly to rotational movement, the bushing 207 and the gasket 209 may bear the majority of the stress related to the sliding of the stem 203.

FIG. 2C depicts the electronic device 100 of FIG. 2A while a user 230 is exerting force to move the input structure 101 towards the housing 204. Translation of the input structure 101 towards the housing 204 decreases gaps between the cap 202 and the housing 204 and/or the collar 208.

Although the moveable conductors 212a, 212b are illustrated and described as separate components with respect to FIGS. 2A-2C, it is understood that this is an example. In various implementations, the moveable conductors 212a, 212b may be a single, unitary component. For example, in some implementations, the moveable conductors 212a, 212b may be a ring positioned around the compliant silicone 213a, 213b.

In various implementations, the electronic device 100 may include additional components that interact with movement of the input structure 101. In some embodiments, the electronic device 100 may include one or more components that resist translation of the input structure 101 towards the housing 204 and/or reverse such translation after force is exerted. For example, in some implementations, the electronic device 100 may include a dome switch or similar actuator mechanism connected in various ways to the stem 203. Translation of the stem 203 may compress the dome switch. Thus, the dome switch may resist translation of the stem 203. However, sufficient force translating the stem 203 may overcome the resistance and compress the dome switch. After exertion of the force, the dome switch may uncompress. This may reverse the translation of the stem 203.

In various embodiments, compression of the dome switch may also provide a tactile output in response to translation of the stem 203. In various implementations, the processing unit 223 may receive one or more signals related to compression or activation of the dome switch. By way of example, see the fourth example of a force-detecting input structure of FIG. 5.

In numerous embodiments, the electronic device 100 may include various mechanisms for detecting rotation, translation, or other movement of the stem 203. For example, in various implementations, one or more detectable elements may be positioned on the stem 203 and/or other components coupled to the stem 203. The detectable element may be any mechanism that is detectable by a detector. The detector may detect the detectable element to track translational, rotational, and/or transverse movement of the stem 203. In some implementations, the detector may be an optical detector, and the detectable element may be a series of coded markings that the optical detector detects to determine position and/or movement of the stem 203 with respect to the detector.

The electronic device 100 may include various additional components. For example, a cover glass 224 and/or display, touch display, and so on may be coupled to the housing 204. Various configurations are possible and contemplated without departing from the scope of the present disclosure.

Although FIGS. 2A-2C illustrate the input structure 101 as having capacitive sensors disposed in the collar 208 that may be used to detect the amount of force applied to transversely move the input structure 101, it is understood that this is an example. Various configurations of the input structure 101 are possible and contemplated without departing from the scope of the present disclosure.

Figure 3:
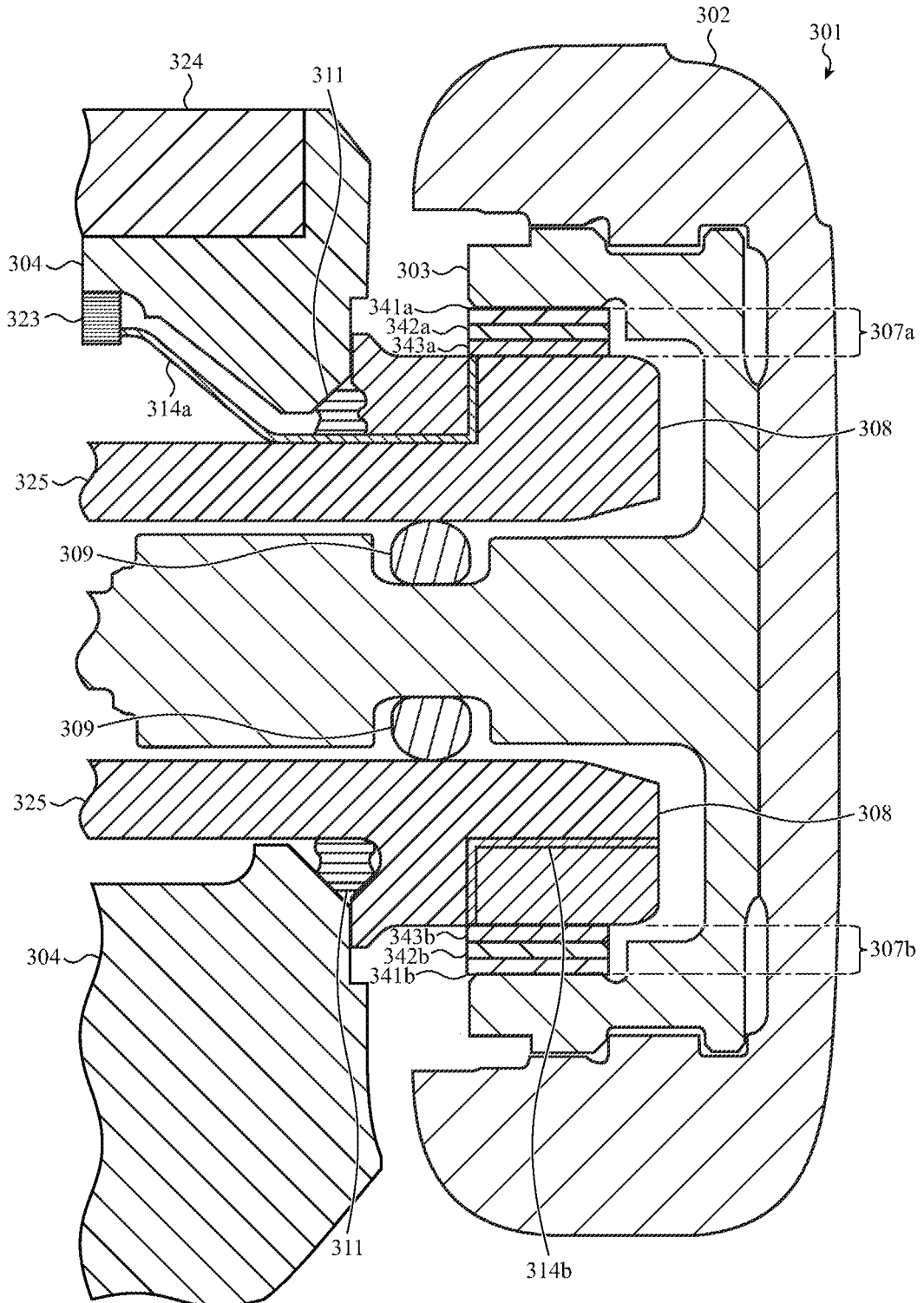
FIG. 3 depicts a second example of a force-detecting input structure in accordance with further embodiments.

For example, FIG. 3 depicts a second example of a force-detecting input structure 301 in accordance with further embodiments. Similar to the input structure 101 of FIGS. 2A-2C, the force-detecting input structure 301 includes a stem 303 slideably coupled to the housing 304, body, or other enclosure via the collar 308 or other coupler. However, in this example, the collar 308 may not include capacitive sensors. Instead, the bushings 307a, 307b may include capacitive sensors that may be used to detect force applied to the force-detecting input structure 301. The capacitive sensors may respectively include first conductors 341a, 341b and second conductors 343a, 343b separated by compliant material 342a, 342b. The compliant material 342a, 342b allows movement of the first conductors 341a, 341b and second conductors 343a, 343b in response to transverse movement of the stem 303. The flex circuits 314a, 314b extend through the collar 308 to the bushings 307a, 307b to connect the respective capacitive sensors to the processing unit 323.

In this example, the first conductors 341a, 341b and second conductors 343a, 343b may be formed of materials that are conductive but still allow sliding of the stem 303 with respect to the collar 308. For example, compliant capacitive materials such as metal-doped polymers may be used. In other implementations, conductive materials that do not allow sliding may be embedded in material that does allow sliding.

In other implementations, the bushings 307a, 307b may not include such conductive materials but may be compliant to allow movement of the stem 303 and the collar 308. In such other implementations, portions of the stem 303 and the collar 308 may be the first and second conductors that form the respective capacitive sensors. For example, the entire bushings 307a, 307b may be formed of such a compliant material, the bushings 307a, 307b may include compliant material within the bushings 307a, 307b that allow the movement, and so on.

Although the bushings 307a, 307b are illustrated as including components forming capacitive sensors in the example shown in FIG. 3, it is understood that this is an example. In other implementations, capacitive sensors may be formed by elements in other components, such as the gasket 309 without departing from the scope of the present disclosure. Further, although the input structures 101 and 301 of FIGS. 2A-2C and 3 illustrate capacitive sensors that are used to detect amounts of force that move the input structures 101 and 301 transversely, it is understood that these are examples. Input structures in other implementations may be configured to detect amounts of force exerted in other directions without departing from the scope of the present disclosure.

Figure 4:
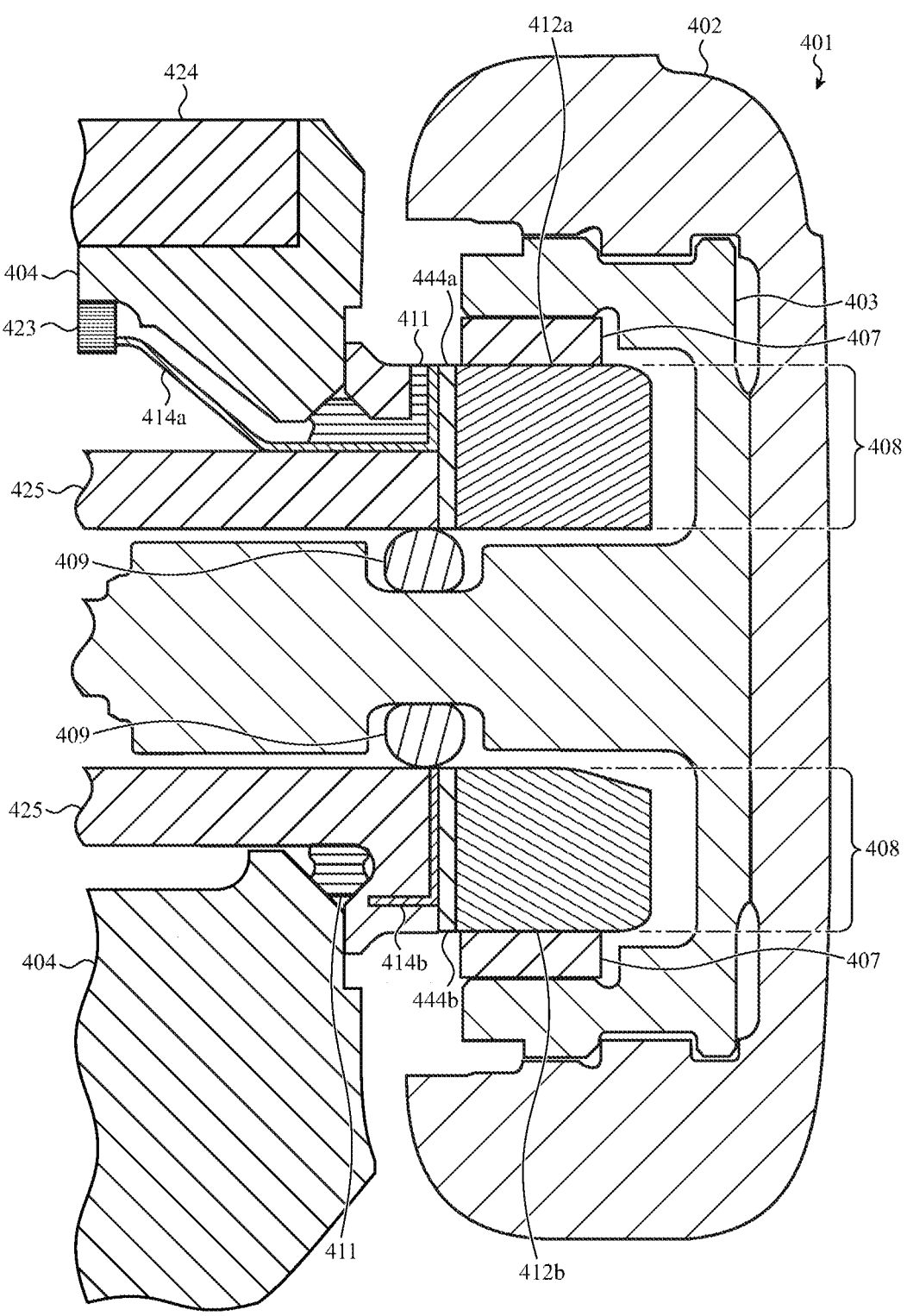
FIG. 4 depicts a third example of a force-detecting input structure in accordance with further embodiments.

For example, FIG. 4 depicts a third example of a force-detecting input structure 401 in accordance with further embodiments where amounts of force that translate the input structure 401 toward and/or away from the housing 404 may be detected. Similar to the input structure 101 of FIGS. 2A-2C, the input structure 401 includes compliant material 444a, 444b, moveable portions 412a, and flex circuits 414a, 414b or other conductive materials. However, in this example, the moveable portions 412a, 412b are moveable by translation of the input structure 401. Thus, capacitive sensors formed by the moveable portions 412a, 412b, the flex circuits 414a, 414b, and the compliant material 444a, 444b may be used to detect amounts of force that translate the input structure 401.

Figure 5:
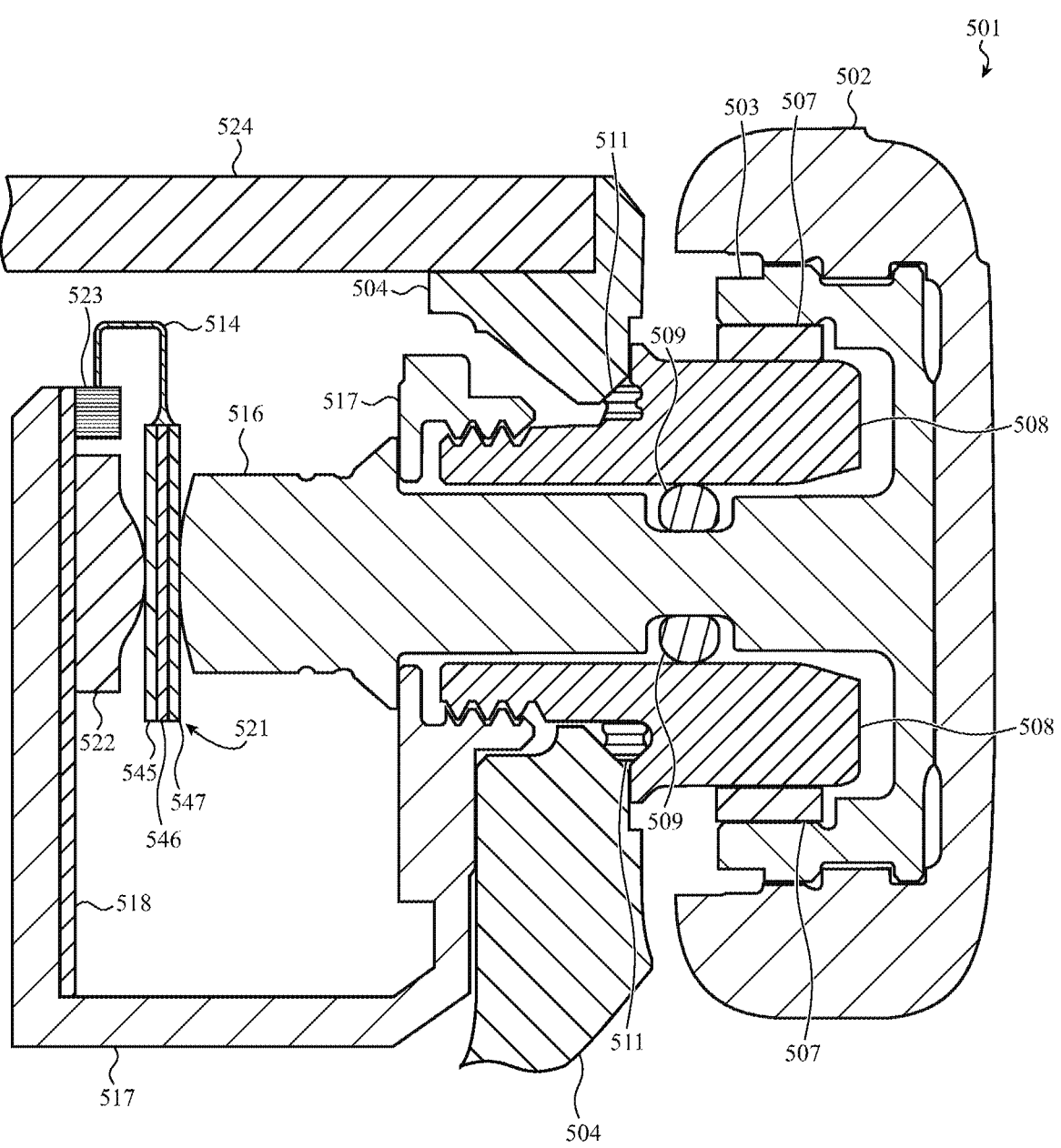
FIG. 5 depicts a fourth example of a force-detecting input structure in accordance with further embodiments.

In still other examples, capacitive sensors may be formed by other components of the input structure 401 and/or electronic devices that include such input structures 401. FIG. 5 depicts a fourth example of a force-detecting input structure 501 in accordance with further embodiments where a shear plate 521 positioned between the stem 503 and a dome switch 522 or other actuator includes such a capacitive sensor.

In this embodiment, a structure 517 couples the collar 508 to the housing 504. The dome switch 522 is mounted to the structure 517 so that translation of the stem 503 may compress the dome switch 522. The shear plate 521 separates the dome switch 522 from the stem 503. Flex circuit 518 and/or other electrical connections connect the dome switch 522 and the processing unit 523.

In this example, the shear plate 521 includes a capacitive sensor formed by a first conductor 545 separated from a second conductor 547 by a compliant material 546. The capacitive sensor may be used to detect amounts of force that translate the input structure 501.

Contrasted with the input structure 101 of FIGS. 2A-2C, this implementation may allow detection of force using the input structure 501 while allowing use of a unitary collar 508. This implementation may also allow detection of force using the input structure 501 without extending the flex circuit 514 through the collar 508, gasket 511, and so on.

Although the examples illustrated in FIGS. 2A-5 directly connect the processing units 223-523 to the respective capacitive sensors, it is understood that these are examples. Other configurations are possible and contemplated without departing from the scope of the present disclosure. For example, in various implementations, wireless connections and/or wireless transmission mechanisms may be used that allow unitary collars 208-508 and/or do not extend electrical connections through gaskets 211-511 and/or other components.

Figure 6:
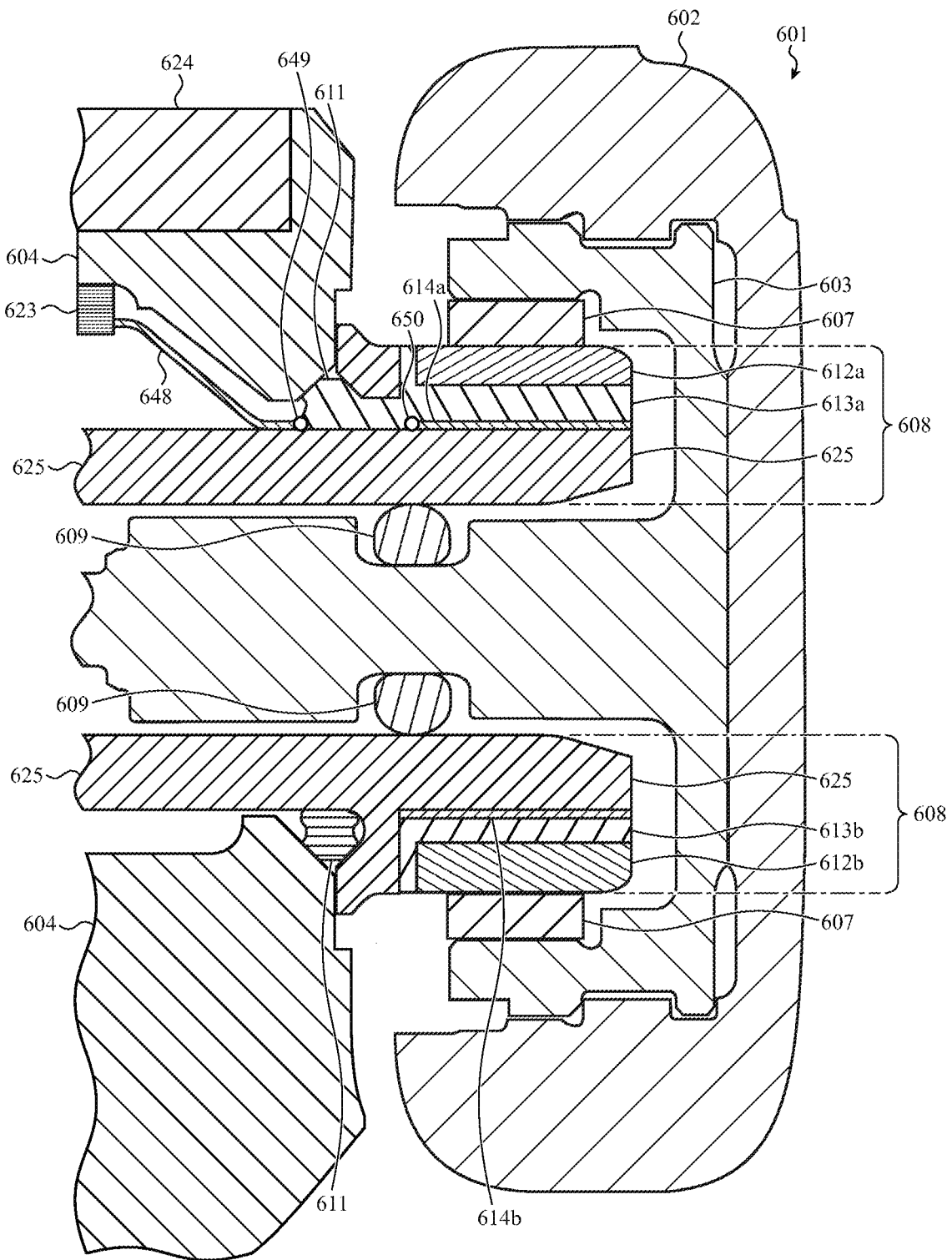
FIG. 6 depicts a fifth example of a force-detecting input structure in accordance with further embodiments.

For example, FIG. 6 depicts a fifth example of a force-detecting input structure 601 in accordance with further embodiments that uses inductive coils 649, 650 as a wireless transmission mechanism to electrically connect capacitive sensors with processing unit 623 (via a flex circuit 648 and/or other electrical connection). In this example, inductive coils 649, 650 inductively exchange power such that the processing unit 623 receives changes in capacitance of capacitive sensors formed by moveable portions 612a, 612b, compliant material 613a, 613b, flex circuits 614a, 614b and/or other electrical connection. In this way, the processing unit 623 may determine applied force without extending the flex circuit 648 through the gasket 611.

Although the examples illustrated in FIGS. 2A-6 detect force applied to the various input structures 101-601 using the various respective capacitive sensors, it is understood that these are examples. In various implementations, force detection sensors other than and/or in addition to capacitive sensors may be used without departing from the scope of the present disclosure. For example, in various implementations, piezoelectric material that generates a voltage when deformed may be used. In such examples, the voltage may be proportional to the amount of deformation, and thus the force exerted. As such, the voltage generated by the piezoelectric material may be correlated to force amounts to determine the force exerted.

Figure 7:
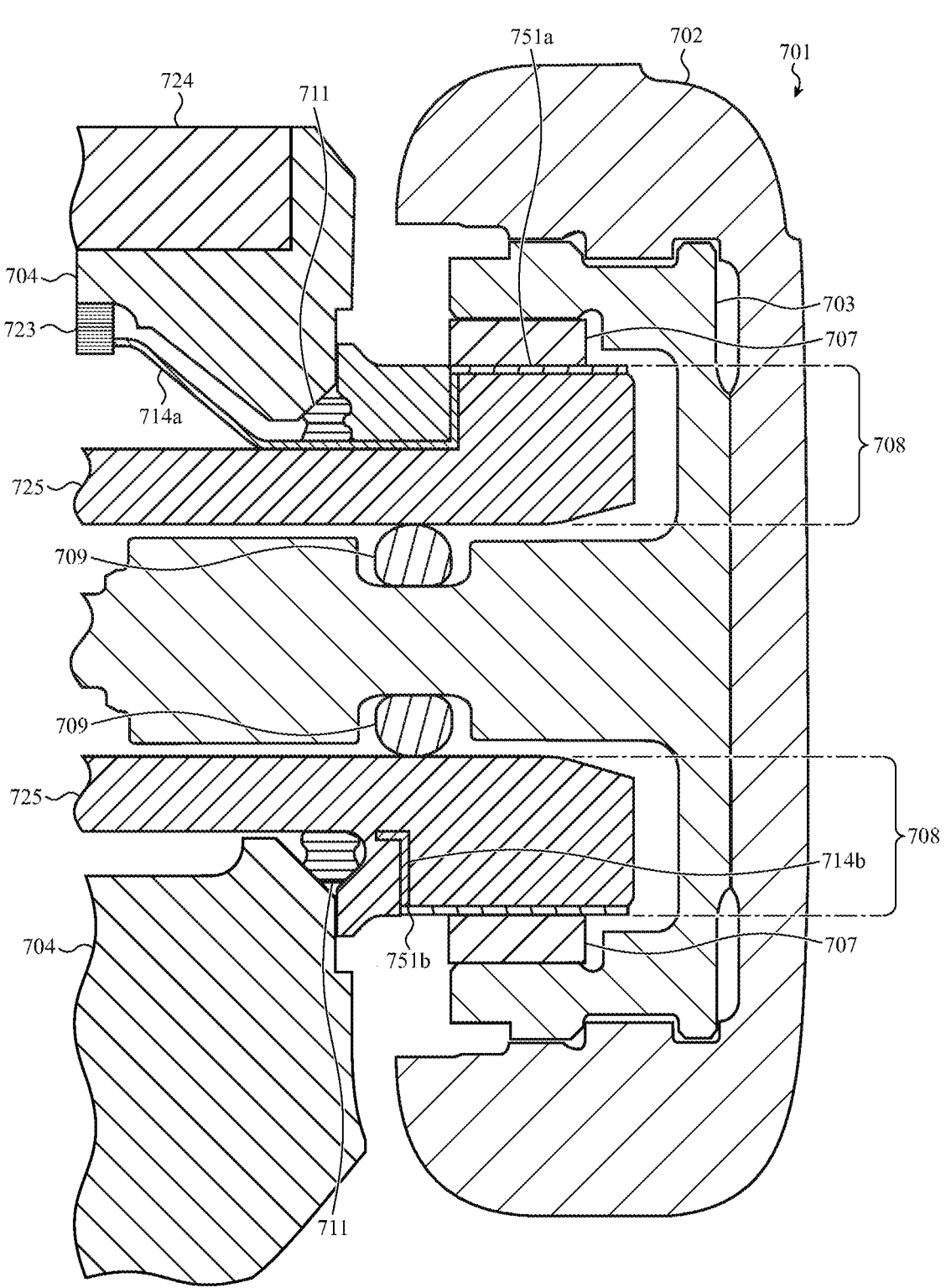
FIG. 7 depicts a sixth example of a force-detecting input structure in accordance with further embodiments.

By way of another example, strain gauges may be used as force detection sensors in various implementations instead of and/or in addition to capacitive sensors. FIG. 7 depicts a sixth example of a force-detecting input structure 701 in accordance with further embodiments that utilize strain gauges 751a, 751b to determine force exerted on the input structure 701.

In this example, the collar 708 may be formed from materials that can be strained by force transferred by the stem 703. Strain gauges 751a, 751b are disposed on the collar 708 in areas of the collar 708 that are strained by the transferred force. The processing unit 723 receives signals indicating the strain via flex circuits 714a, 714b and/or electrical connections and may correlate the strain to force amounts to determine force applied to the input structure 701.

Although FIG. 7 illustrates a particular configuration of strain gauges 751a, 751b, it is understood that this is an example. In various implementations, various components may be strained by force applied to the input structure 701 and strain gauges 751a, 751b may be disposed on and/or in such components.

Figure 8:
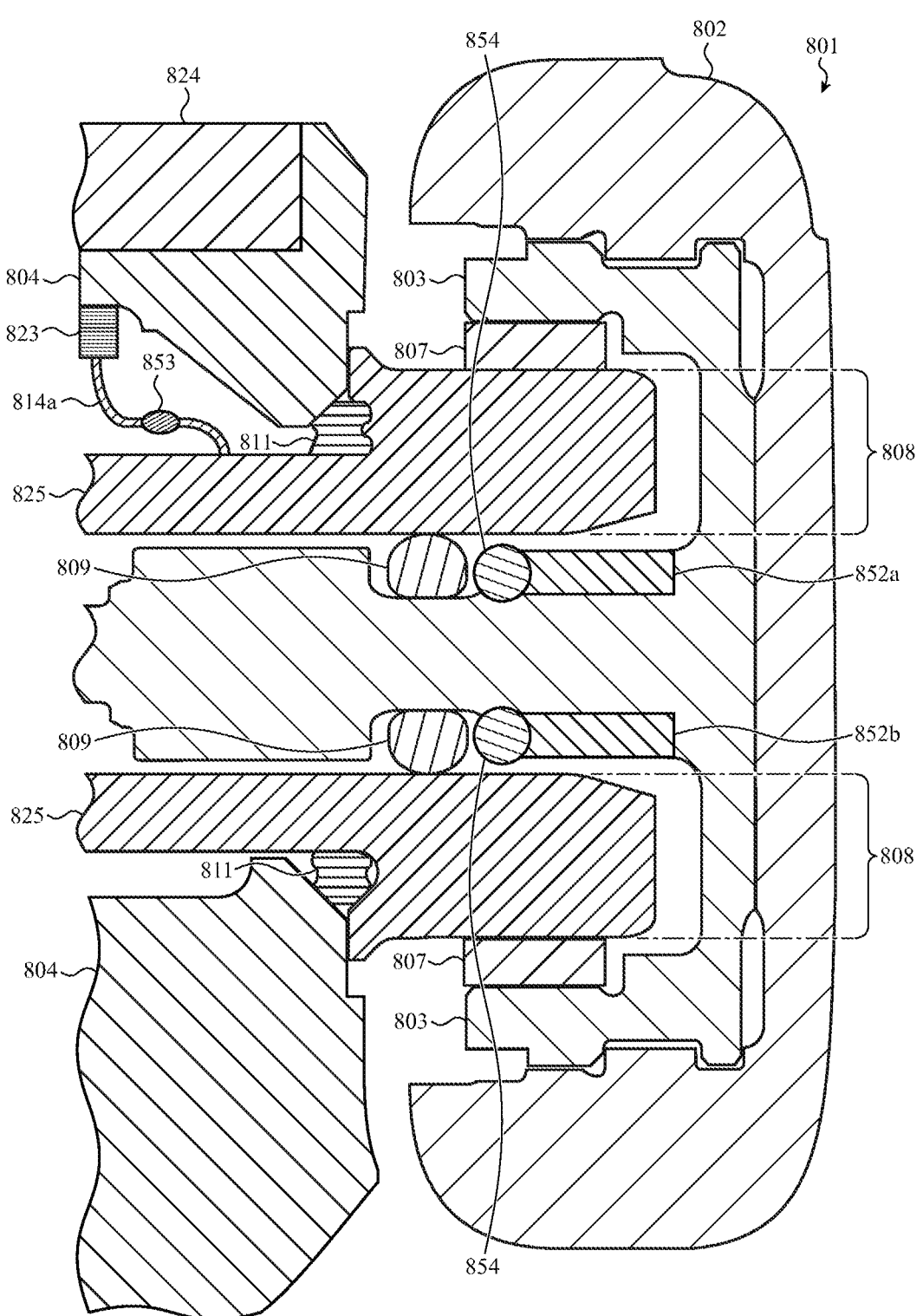
FIG. 8 depicts a seventh example of a force-detecting input structure in accordance with further embodiments.

By way of example, FIG. 8 depicts a seventh example of a force-detecting input structure 801 in accordance with further embodiments. In this example, a shaft of the stem 803 may be formed from a material that is strained by force exerted on the stem 803 and strain gauges 852a, 852b may be disposed on the shaft. The processing unit 823 may wirelessly receive strain data from the strain gauges 852a, 852b via inductive coils 853, 854 (to which the processing unit 823 may be coupled via the flex circuit 814 and/or other electrical connections). The processing unit 823 may correlate the strain to force amounts to determine force applied to the input structure 801.

Figure 9:
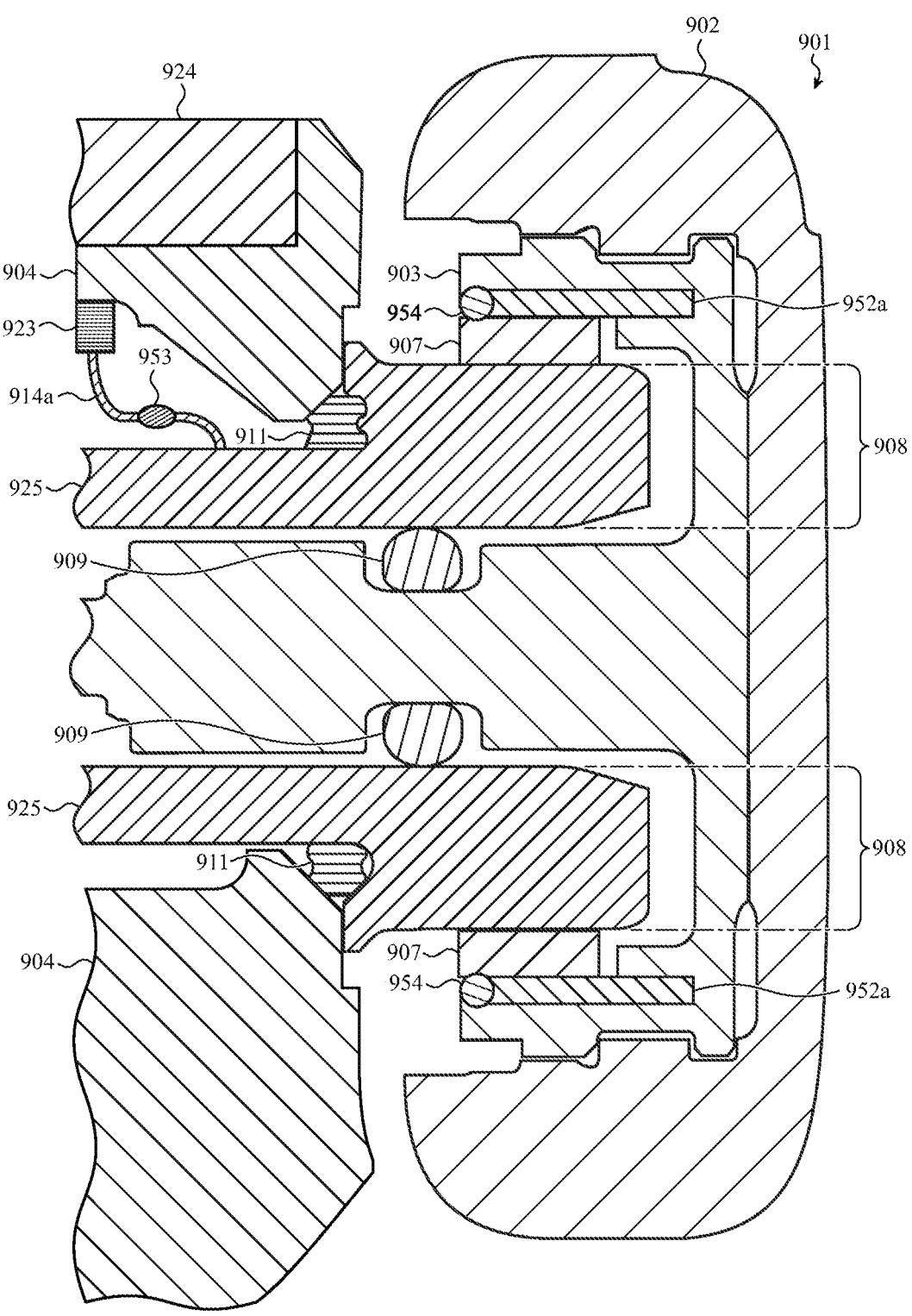
FIG. 9 depicts an eighth example of a force-detecting input structure in accordance with further embodiments.

By way of another example, FIG. 9 depicts an eighth example of a force-detecting input structure 901 in accordance with further embodiments. In this example, arms 955a, 955b of the stem 903 may be formed from a material that is strained by force exerted on the stem 903 and strain gauges 952a, 952b may be disposed on the arms 955a, 955b. The processing unit 923 may wirelessly receive strain data via inductive coils 953, 954 and the flex circuit 914 and/or other electrical connection and correlate the strain to force amounts.

Although FIGS. 2A-9 illustrate and describe various force sensors that are variously configured and positioned to detect the amount of forces applied to the respective input structures 101-901 in various directions, it is understood that these are examples. In various implementations, any kind of force sensors may be located in a variety of different areas to detect the amount of a variety of different forces that may be exerted on the input structures 101-901 without departing from the scope of the present disclosure.

Further, although the input structures 101-901 are illustrated as crowns with respect to FIGS. 2A-9, it is understood that these are examples. In various implementations, the techniques discussed herein may be utilized with a variety of different input mechanisms and/or input mechanism assemblies without departing from the scope of the present disclosure. Such input mechanisms may be operable to receive translational input, rotational input, input related to transverse movement, and/or a variety of different movement related input.

Additionally, although the electronic devices 100 of FIGS. 1-9 are illustrated as a smart watch, it is understood that these are examples. In various implementations, the techniques illustrated and described herein may be utilized with a variety of different devices without departing from the scope of the present disclosure. Such devices may include wearable electronic devices, laptop computing devices, cellular telephones, displays, tablet computing devices, mobile computing devices, smart phones, digital media players, desktop computing devices, printers, speakers, input devices, and so on.

Figure 10:
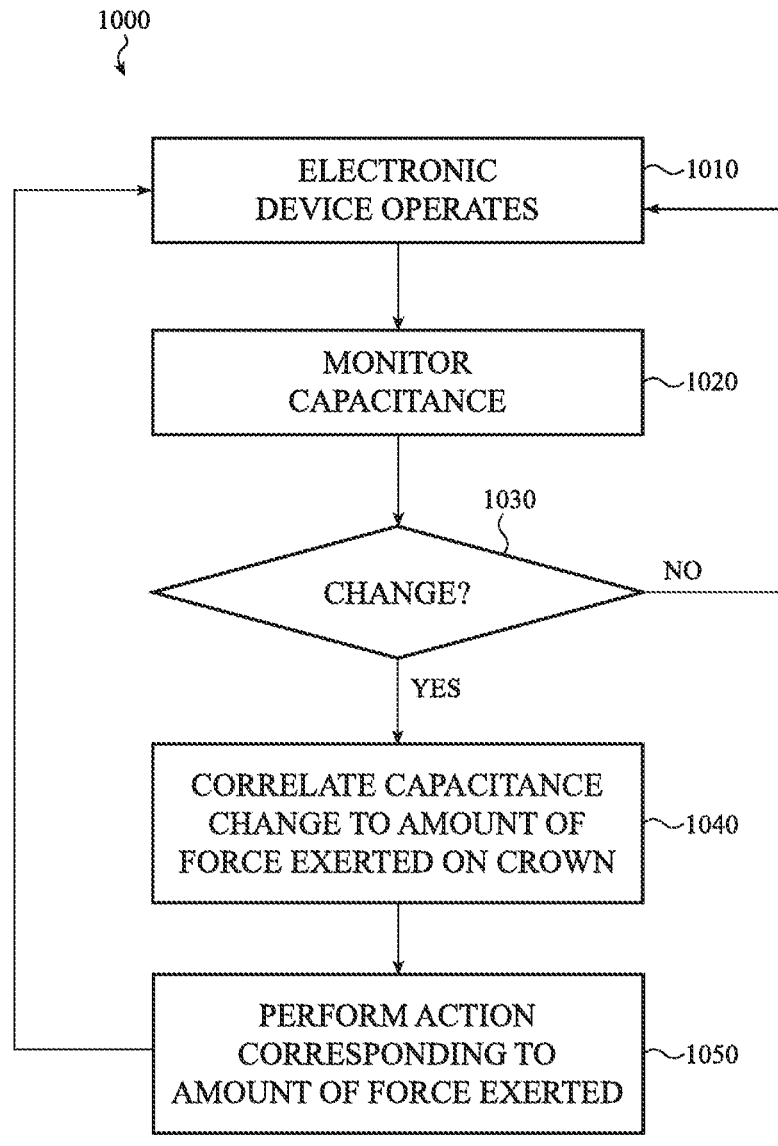
FIG. 10 depicts a flow chart illustrating an example method for detecting force applied to a crown. This method may be performed by the electronic devices of FIGS. 1-6.

FIG. 10 depicts a flow chart illustrating an example method 1000 for detecting force applied to a crown or other input structure. This method 1000 may be performed by the electronic devices 100 of FIGS. 1-6.

At 1010, an electronic device operates. The flow proceeds to 1020 where the electronic device monitors the capacitance of one or more capacitive sensors associated with force exerted on an input mechanism such as a crown. Next, the flow proceeds to 1030 where the electronic device determines whether or not the capacitance has changed.

If the capacitance has not changed, the flow returns to 1010 where the electronic device continues to operate. Otherwise, the flow proceeds to 1040.

At 1040, after the electronic device determines that the capacitance of one or more capacitive sensors associated with force exerted on an input mechanism such as a crown has changed, the electronic device correlates the capacitance change to an amount of force. The flow then proceeds to 1050 where the electronic device performs one or more actions corresponding to the force amount.

For example, the electronic device may interpret the force amount as input indicating to select an icon displayed on a display and/or to execute an application associated with such an icon. In some examples, the electronic device may interpret the force amount as input indicating to select the icon displayed on the display if the force amount exceeds a first force threshold and to execute the application associated with the icon if the force amount exceeds a second, greater threshold. In this way, application of force may be used by a user to signal actions typically triggered by a single mouse click and a double mouse click of the icon without utilization of a mouse as an input device.

From 1050, after the electronic device performs the one or more actions corresponding to the amount of force, the flow returns to 1010. At 1010, the electronic device continues to operate.

Although the example method 1000 is illustrated and described as including particular operations performed in a particular order, it is understood that this is an example. In various implementations, various orders of the same, similar, and/or different operations may be performed without departing from the scope of the present disclosure.

For example, the example method 1000 is illustrated and described as monitoring changes in the capacitance of a capacitive sensor and determining force amounts based on such changes. However, in various implementations, force sensors other than capacitive sensors may be used without departing from the scope of the present disclosure. Use of such other force sensors may include monitoring voltages generated by deformation of piezoelectric material, receiving signals from one or more strain gauges, and so on.

As described above and illustrated in the accompanying figures, the present disclosure relates to a crown or other input mechanism included in an electronic device, such as a button, key, switch, surface, or the like. The crown may rotate, translate, move transversely, and so on. The crown may include one or more force sensors positioned in the input mechanism that may be used to determine an amount of force applied to the crown. In this way, the crown may be used to receive a variety of different inputs from the user.

In the present disclosure, the methods disclosed may be implemented as sets of instructions or software readable by a device. Further, it is understood that the specific order or hierarchy of steps in the methods disclosed are examples of sample approaches. In other embodiments, the specific order or hierarchy of steps in the method can be rearranged while remaining within the disclosed subject matter. The accompanying method claims present elements of the various steps in a sample order, and are not necessarily meant to be limited to the specific order or hierarchy presented.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not targeted to be exhaustive or to limit the embodiments to the precise forms disclosed. It will be apparent to one of ordinary skill in the art that many modifications and variations are possible in view of the above teachings.

What is claimed is:

1. An electronic device, comprising:
a housing defining an internal volume of the electronic device;
a processing system within the internal volume of the electronic device;
a crown assembly comprising:
an input structure positioned along an external side of the electronic device, the input structure configured to receive an axial input;
a force-sensitive structure coupled to the input structure and positioned outside of the internal volume of the electronic device; and
a conductive element extending from the input structure and through a sealed interface into the internal volume of the electronic device, the conductive element operatively coupling the force-sensitive structure to the processing system; and
wherein the processing system detects the axial input in response to a signal received via the conductive element.

2. The electronic device of claim 1, wherein the processing system is further configured to to determine an amount of force applied to the input structure.

3. The electronic device of claim 1, further comprising wherein:
the force-sensitive structure comprises:
a pair of conductive pads defining a separation; and
silicone disposed within the separation; and
the processing system is configured to detect, via the conductive element, a change in the separation between the pair of conductive pads.

4. The electronic device of claim 1, wherein the conductive element comprises a flex circuit.

5. The electronic device of claim 1, wherein the crown assembly further comprises:

a collar comprising:
an inner core to which the conductive element is coupled; and
a compliant material disposed between the force-sensitive structure and the conductive element.

6. The electronic device of claim 1, wherein:
the force-sensitive structure comprises a conductor;
the crown assembly comprises a plurality of capacitive sensors formed by a flex circuit and the conductive element; and
the processing system is configured to detect a change in capacitance in response to the axial input.

7. An electronic watch comprising:
a housing defining an internal portion of the electronic watch;
a crown cap positioned externally with respect to the housing, the crown cap configured to rotate in response to a rotational input and translate in response to an actuation input;
a stem extending from the crown cap to the internal portion of the electronic watch;
a force-sensing system comprising:
a force-sensitive structure positioned external to the housing; and
a conductor configured to produce a signal in response to detecting a change in an electrical property defined in part by a state of the force-sensitive structure due to the actuation input, the conductor extending from the crown cap to the internal portion of the electronic watch; and
a processing system operably coupled to the force-sensing system, the processing system configured to detect the actuation input or the rotational input.

8. The electronic watch of claim 7, wherein the force-sensitive structure is configured to rotate or translate with the cap in response to the rotational input or the actuation input.

9. The electronic watch of claim 7, wherein the processing system is further configured to determine a direction of the actuation input.

10. The electronic watch of claim 7, wherein the force-sensitive structure comprises a strain gauge.

11. The electronic watch of claim 7, wherein:
the electronic watch further comprises a collar coupled to the housing and at least partially surrounding the stem; and
the force-sensitive structure is captured between the stem and the collar such that the force-sensitive structure couples the stem to the collar.

12. The electronic watch of claim 11, wherein:
the electronic watch comprises a sealing element positioned between the housing and the collar and configured to prevent ingress of liquid into the housing; and
the conductor extends between the sealing element and the collar.

13. The electronic watch of claim 7, wherein the force-sensing system comprises a compliant material captured between the force-sensitive structure and the conductor.

14. An electronic device comprising:
a housing defining an internal cavity;
a display positioned at least partially within the internal cavity;
a crown assembly configured to receive a user input, the crown assembly comprising:
an external crown portion configured to rotate or translate in response to the user input; and

a force-sensitive structure configured to produce a signal in response to a user input, the force-sensitive structure external to the housing; and a conductor operably coupled to the force-sensitive structure, the conductor extending from the force-sensitive structure to the internal cavity of the housing; and a processing system configured to detect a signal generated by the conductor due to the user input and cause a change in the display based on the received signal.

15. The electronic device of claim 14, wherein the force-sensitive structure is configured to rotate concurrently with the external crown portion, thereby generating a change in an electrical property detected by the processing system.

16. The electronic device of claim 14, wherein the force-sensitive structure comprises a compliant silicone material.

17. The electronic device of claim 14, wherein the force-sensitive structure is configured to move concurrently with the external crown portion in response to a translational input.

18. The electronic device of claim 17, wherein the processing system is configured to measure a magnitude of force applied during the translational input.

19. The electronic device of claim 14, wherein the force-sensitive structure is configured to detect a transverse input applied along a direction perpendicular to a rotational axis of the external crown portion.

20. The electronic device of claim 14, wherein the force-sensitive structure comprises a conductive pad configured and a change in position in the conductive pad with respect to the conductor generates the signal.

\*   \*   \*   \*   \*